United States Patent
Kim et al.

(10) Patent No.: US 9,927,501 B2
(45) Date of Patent: Mar. 27, 2018

(54) ATOMIC MAGNETOMETER AND OPERATING METHOD OF THE SAME

(71) Applicant: Korea Research Institute of Standards and Science, Daejeon (KR)

(72) Inventors: Kiwoong Kim, Daejeon (KR); Hyun-joon Lee, Busan (KR); Jeong-Hyun Shim, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 500 days.

(21) Appl. No.: 14/573,718

(22) Filed: Dec. 17, 2014

(65) Prior Publication Data

US 2016/0116553 A1    Apr. 28, 2016

(30) Foreign Application Priority Data

Oct. 24, 2014    (KR) .................. 10-2014-0145487

(51) Int. Cl.
*G01R 33/26*    (2006.01)
*G01R 33/032*    (2006.01)

(52) U.S. Cl.
CPC .......... *G01R 33/26* (2013.01); *G01R 33/032* (2013.01)

(58) Field of Classification Search
None
See application file for complete search history.

(56) References Cited

U.S. PATENT DOCUMENTS

| | | | | |
|---|---|---|---|---|
| 4,680,551 A | * | 7/1987 | O'Donnell | G01R 33/24 324/318 |
| 5,130,655 A | * | 7/1992 | Conti | G01V 3/28 324/247 |
| 7,652,473 B2 | * | 1/2010 | Kawabata | G01R 33/26 324/301 |
| 7,826,065 B1 | * | 11/2010 | Okandan | G01B 11/02 324/244.1 |

(Continued)

FOREIGN PATENT DOCUMENTS

| | | |
|---|---|---|
| JP | 2009236598 | 10/2009 |
| JP | 2013-238586 A | 11/2013 |

(Continued)

*Primary Examiner* — Melissa Koval
*Assistant Examiner* — Nasima Monsur
(74) *Attorney, Agent, or Firm* — Jenkins, Wilson, Taylor & Hunt, P.A.

(57) ABSTRACT

Provided are an atomic magnetometer and an operating method of the same. The atomic magnetometer includes a vapor cell receiving a circularly polarized pump beam and a linearly polarized probe beam and containing an alkali metal vapor, a detector adapted to receive the probe beam passing through the vapor cell to measure magneto-optical rotation of the probe beam, a feedback coil to establish a negative feedback magnetic field signal orthogonal to a first plane defined by traveling directions of the probe beam and the pump beam and provide the negative feedback magnetic field signal to the vapor cell, and a feedback amplifier adapted to provide feedback current to the feedback coil such that the negative feedback magnetic field proportional to a measurement magnetic field is established. The measurement magnetic field of a measurement target provides magneto-optical rotation of the probe beam in the vapor cell.

21 Claims, 20 Drawing Sheets

(56) References Cited

U.S. PATENT DOCUMENTS

| | | | | |
|---|---|---|---|---|
| 8,212,556 B1* | 7/2012 | Schwindt | ............... | G01R 33/26 |
| | | | | 324/301 |
| 9,024,634 B2 | 5/2015 | Hokari | | |
| 2008/0106261 A1* | 5/2008 | Romalis | ............... | G01R 33/441 |
| | | | | 324/304 |
| 2011/0025323 A1* | 2/2011 | Budker | .................. | G01R 33/26 |
| | | | | 324/304 |
| 2011/0193555 A1* | 8/2011 | Sugioka | ............... | G01R 33/022 |
| | | | | 324/244.1 |
| 2013/0278253 A1 | 10/2013 | Ichihara et al. | | |

FOREIGN PATENT DOCUMENTS

| | | |
|---|---|---|
| JP | 2014055987 | 3/2014 |
| JP | 5799553 B2 | 10/2015 |

\* cited by examiner

ATOMIC MAGNETOMETER AND OPERATING METHOD OF THE SAME

CROSS-REFERENCE TO RELATED APPLICATION

This U.S. non-provisional application claims priority under 35 U.S.C. § 119 to Korea Patent Application No. 10-2014-0145487 filed on Oct. 24, 2014, the entirety of which is hereby incorporated by reference.

BACKGROUND

1. Field of the Invention

The present invention generally relates to atomic magnetometers and, more particularly, atomic magnetometers having negative feedback.

2. Description of the Related Art

In the ubiquitous health (U-Health) age pursuing safety life and healthy life that are the trends of 21 century, development and measurement/analysis techniques of a biomagnetic measurement apparatus, such as magnetocardiography (hereinafter referred to as "MCG") and magnetoencephalography (hereinafter referred to as "MEG"), based on a technique of an optical-pumping atomic magnetometer that is an ultra-sensitive magnetic sensor (magnetometer) are core techniques for the next-generation ultra-sensitive instant diagnosis system.

In particular, ultra-sensitive magnetic measurement techniques have been widely researched in various fields ranging from pure learning to industry. In a magnetic measurement technique, the direction of application varies depending on a measuring range. Recently, a microfabricated atomic magnetometer was developed by P. Schwindt of NIST. It is expected that researches will be made on the microfabricated atomic magnetometer grafted onto the ubiquitous technology to be applied to portable magnetic resonance imaging, a buried explosive detector, a remote mineral meter, and the like.

A spin-exchange-relaxation-free (SERF) atomic magnetometer has been researched in recent years. The SERF atomic magnetometer may be used at room temperature without a coolant while exhibiting sensitivity equal to that of a SQUID sensor. Accordingly, the SERF atomic magnetometer may be used in all SQUID precise measurement fields that have been searched for a long time. As a result, the development of an atomic magnetometer technique will further improve and advance excellent magnetic measurement application techniques.

In particular, the SERF atomic magnetometer will be widely used in technical development of noncryogenic MCG/MEG measurement. It is expected that world-leading research and development will be made in the atomic magnetometer field by combining the SERF atomic magnetometer technique with a biomagnetic measuring technique, an atomic clock technique, and a spectroscopic technique. Subsequent researches will be widely used in progress of a precise absolute magnetic measurement technique and development of various magnetic-based nondestructive inspection techniques.

An existing technique used in precise magnetic measurement has been searched through various methods such as magnetic resonance (e.g., nuclear magnetic resonance, optical pumping, etc.) and magnetometer using the Hall effects or fluxgate principle. These methods have advantages and disadvantages depending on magnetic measurement methods. A fluxgate magnetometer can be easily manufactured because its measurement method is simple. However, the fluxgate magnetometer is limited in measuring a low magnetic field.

A magnetic field is one of the most basic physical quantities that can be observed everywhere. The magnetic field transfers information on all electromagnetic phenomena. A high-sensitive magnetic measurement technique has been researched with wide attention from pure learning to industry. Currently, a SQUID-based sensor has been used as a high-sensitive magnetic measurement apparatus that is most sensitive to a magnetic field. However, the SQUID-based sensor does not come into wide use due to theoretical measurement limitation and costs required for ultra-low temperature cooling for a superconducting phenomenon and required for maintaining the same.

In order to overcome the above disadvantage, vigorous searches have been made on magnetometers using interaction between light and resonating atoms. Sensitivity of an atomic magnetometer may be equal to or greater than that of a SQUID-based magnetometer. Thus, a biomagnetic filed that can be measured only by a SQUID sensor may be measured by an atomic magnetometer that need not be cooled and maintained. For this reason, a biomagnetic diagnosis technique useful in medical diagnosis such as epilepsy, brain function mapping, myocardial infarction, arrhythmia, and fetal function may come into wide use.

In recent years, various researches have been made theoretically and experimentally on small magnetic field measurement using interaction between atoms and laser.

The Scully Group theoretically calculated a small magnetic field measurement limitation arising from nonlinear magneto-optic effect at a coherent atomic medium. According to the research, it was reported that a limitation of magnetic field measurement sensitivity was 0.6 $fT/Hz^{1/2}$ when Rb atoms were used.

In 2003, the Romalis Group showed that a magnetic field can be measured with sensitivity of 0.54 $fT/Hz^{1/2}$ by using a method of detecting Larmor spin precession based on optical pumping.

In 2004, the Hollberg Group of NIST developed a magnetic field measurement sensor having height of 3.9 mm and volume of 12 $mm^3$ using coherent population trapping (CPT). Measured sensitivity of the sensor was about 50 $pT/Hz^{1/2}$.

In 2006, the Budker Group developed a magnetic field measurement sensor by forming an anti-relaxation coated spherical cell having a diameter of 3 mm. It was reported that measured sensitivity of the sensor was 4 $pT/Hz^{1/2}$.

Recently, a microfabricated atomic magnetometer was developed by P. Schwindt of NIST. It is expected that researches will be made on the microfabricated atomic magnetometer grafted onto the ubiquitous technology to be applied to portable magnetic resonance imaging, a buried explosive detector, a remote mineral meter, and the like.

Recently, the Romalis Group developed an atomic magnetometer having magnetic field measurement sensitivity of 160 $aT/Hz^{1/2}$ in a spin exchange relation free (SERF) regime.

SUMMARY

A subject matter of the present invention is to provide a small magnetic field measurement technique having negative feedback when a small magnetic field established at a small metal material or a living body is measured by measuring the intensity and direction of an external magnetic field through interaction of an atom and light in spin precession of the atom changed by the external magnetic field.

Embodiments of the present invention provide an atomic magnetometer. In an example embodiment, the atomic magnetometer may include a vapor cell receiving a circularly polarized pump beam and a linearly polarized probe beam and containing an alkali metal vapor; a detector adapted to receive the probe beam passing through the vapor cell to measure magneto-optical rotation of the probe beam; a feedback coil to establish a negative feedback magnetic field signal orthogonal to a first plane defined by traveling directions of the probe beam and the pump beam and provide the negative feedback magnetic field signal to the vapor cell; and a feedback amplifier adapted to provide feedback current to the feedback coil such that the negative feedback magnetic field proportional to a measurement magnetic field is established. The measurement magnetic field of a measurement target may provide magneto-optical rotation of the probe beam in the vapor cell.

In an example embodiment, the feedback coil and the feedback amplifier may extend detection bandwidth of the atomic magnetometer.

In an example embodiment, a frequency response of the atomic magnetometer may be flat from zero hertz (Hz) to hundreds of hertz (Hz).

In an example embodiment, the atomic magnetometer may further include a magnetic shielding part disposed around the vapor cell and made of a magnetic material to remove an external environmental magnetic field.

In an example embodiment, the atomic magnetometer may further include a magnetic field compensation part disposed around the vapor cell and generating a compensation magnetic field to remove an external environmental magnetic field.

In an example embodiment, the magnetic field compensation part may include an x-axis compensation coil to establish an x-axis compensation magnetic field; an x-axis compensation power source to provide current to the x-axis compensation coil; a z-axis compensation coil to establish a z-axis compensation magnetic field orthogonal to the x-axis compensation magnetic field; a z-axis compensation power source to provide current to the z-axis compensation coil; a y-axis compensation coil to establish a y-axis compensation magnetic field orthogonal to a first plane; and a y-axis compensation power source to provide DC current to the y-axis compensation coil.

In an example embodiment, the magnetic field compensation part may further include one of an x-axis lock-in amplifier receiving an output signal of the detector as an input to extract and output the first reference frequency component; and a z-axis lock-in amplifier receiving the output signal of the detector as an input to extract and output a second reference frequency component. The x-axis lock-in amplifier may provide a first reference frequency signal to the x-axis compensation power source. The z-axis lock-in amplifier may provide a second reference frequency signal to the z-axis compensation power source. The x-axis compensation power source may receive and modulate the first reference frequency signal of the x-axis lock-in amplifier and the second reference frequency component of the z-axis lock-in amplifier to output the first reference frequency signal. The z-axis compensation power source may receive and module the second reference frequency signal of the z-axis lock-in amplifier and the first reference frequency component of the x-axis lock-in amplifier to output the second reference frequency signal.

In an example embodiment, the vapor cell may include a main cell containing potassium (K) as an alkali metal vapor, a helium buffer gas, and a nitrogen quenching gas; and a stem cell to prevent adsorption of the alkali metal vapor.

In an example embodiment, the main cell may be a borosilicate glass material, and the stem cell may be aluminosilicate glass.

In an example embodiment, the vapor cell may include a main cell having a hexahedronal shape and a cylindrical stem cell connected to the main cell. The vapor cell may further include a heating part adapted to heat the vapor cell. The heating part may include a first heating part to apply alternating current of 5 kHz to 30 kHz to a heating wire to heat the main cell of the vapor cell at temperature of 200 degrees centigrade; and a second heating part to apply alternating current of 5 kHz to 30 kHz to a heating wire to heat the stem cell of the vapor cell at temperature of 185 degrees centigrade. A difference between the temperature of the main cell and the temperature of the stem cell is constantly maintained.

In an example embodiment, the heating part may include a first heating block including a through-hole formed on its bottom surface and a transparent window formed on its side surface and disposed to cover the periphery of the main cell; a first heating coil disposed to cover an outer circumferential surface of the first heating block; a second heating block aligned with the through-hole of the first heating block and disposed to cover the periphery of the stem cell; a second heating coil disposed to cover the second heating block; and a thermally insulating block to store the first heating block. The main cell may be aligned with the transparent window of the first heating block.

In an example embodiment, the thermally insulating block may include a central thermally insulating block including a through-hole formed in its center, a recessed portion aligned with the through-hole, a protrusion disposed outside the recessed portion, and an alignment trench formed on a top surface of the protrusion; an upper thermally insulating block inserted into an upper alignment trench of the protrusion and including a through-hole formed on its side surface; and a lower thermally insulating block inserted into a lower alignment trench formed on a bottom surface of the protrusion.

In an example embodiment, the atomic magnetometer may further include a support block inserted and combined with a bottom surface of the second heating block and inserted and combined with the lower thermally insulating block; and an outer thermally insulating block disposed on the support block and disposed to cover the thermally insulating block.

In an example embodiment, the atomic magnetometer may further include a pump beam light source providing the pump beam; a probe beam light source providing the probe beam; a modulator disposed between the probe beam light source and the vapor cell to modulate a polarization rotation angle of the probe beam to a predetermined modulation frequency; and a lock-in amplifier providing a reference modulation frequency signal of the modulation frequency to the modulator and receiving an output signal of the detector to extract a modulation frequency component or a high-frequency harmonics components.

Embodiments of the present invention provide an operating method of an atomic magnetometer. In an example embodiment, the operating method may include providing a circularly polarized pump beam and a linearly polarized probe beam to a vapor cell containing an alkali metal vapor under a measurement magnetic field established by a measurement target; detecting a polarization rotation signal from the linearly polarization probe beam passing through the vapor cell according to a polarization state of the probe beam by using a detector; and amplifying the polarization rotation signal to establish a negative feedback magnetic field of a direction opposite to that of the measurement magnetic field and provide the negative feedback magnetic field to the vapor cell.

In an example embodiment, detecting the polarization rotation signal may include splitting the probe beam passing through the vapor cell into a first polarization beam and a second polarization beam of different polarization directions; measuring the intensity of the first polarization beam and the intensity of the second polarization beam; and extracting a polarization rotation angle signal using a difference between a first measurement signal of the first polarization beam and a second measurement signal of the second polarization beam.

In an example embodiment, detecting the polarization rotation signal may include modulating a polarization rotation angle of the probe beam to a predetermined modulation frequency at the front end of the vapor cell; measuring the intensity of 90-rotated probe beam in an initial polarization state by making the probe beam pass through the vapor cell and a linear polarizer; and extracting a polarization rotation angle of the probe beam as a modulation frequency component or its high-frequency harmonics components from the measured intensity of the probe beam.

In an example embodiment, detecting the polarization rotation signal may include modulating a polarization rotation angle of the probe beam to a predetermined modulation frequency by making the probe beam pass through a quarter wave plate and a modulator at the back end of the vapor cell; measuring the intensity of the probe beam by making the probe beam pass through the linear polarizer; and extracting a polarization rotation angle of the probe beam as a modulation frequency component or its high-frequency harmonics components from the measured intensity of the probe beam.

In an example embodiment, the operating method may further include establishing a compensation magnetic field to remove an external environmental magnetic field having an effect on the vapor cell while the measurement target is removed. The compensation magnetic field may include a y-axis compensation magnetic field orthogonal to a first plane to which the pump beam and the probe beam travels, an x-axis compensation magnetic field parallel to the first plane, and a z-axis compensation magnetic field orthogonal to the x-axis compensation magnetic field. The y-axis compensation magnetic field may be set to a y-axis DC value such that the polarization rotation angle is made zero under the external environment magnetic field. The x-axis compensation magnetic field may be set to an x-axis DC value such that the polarization rotation angle is made zero under the external environmental magnetic field. The z-axis compensation magnetic field may be set to a z-axis DC value such that the polarization rotation angle is made zero under the external environmental magnetic field.

Embodiments of the present invention provide an operating method of an atomic magnetometer including a vapor cell receiving a circularly polarized pump beam and a linearly polarized probe beam and containing an alkali metal vapor and a detector adapted to receive the linearly polarized probe beam passing through the vapor cell to measure polarization rotation angle of the probe beam. In an example embodiment, a negative feedback magnetic field of a direction opposite to that of a measurement magnetic field of a measurement target may be provided to the vapor cell to extend detection bandwidth of the vapor by amplifying an output signal of the detector.

In an example embodiment, a frequency response of the atomic magnetometer may be flat from zero hertz (Hz) to hundreds of hertz (Hz).

Embodiments of the present invention provide a biomagnetic filed measuring method. In an example embodiment, the biomagnetic field measuring method may include measuring a measurement signal of a measurement target establishing a biomagnetic field by using a sin-exchange relation free atomic magnetometer; and providing a negative feedback magnetic field of a direction opposite to that of the biomagnetic field to the atomic magnetometer by amplifying the measurement signal. A frequency response of the atomic magnetometer may have a Lorentzian shape by negative feedback, and a cut-off frequency of the frequency response may be hundreds of hertz (Hz).

Embodiments of the present invention provide an atomic magnetometer. In an example embodiment, the atomic magnetometer may include a vapor cell receiving a circularly polarized pump beam and a linearly polarized probe beam and containing an alkali metal vapor; a detector adapted to receive the probe beam passing through the vapor cell to measure magneto-optical rotation of the probe beam; a pump laser to provide the circularly polarized pump beam; and a pump beam light intensity modulation part adapted to receive an output signal of the detector such that a negative feedback driving signal proportional to a measurement magnetic field is established to control the light intensity of the pump beam light source. The measurement magnetic field of a measurement target may provide magneto-optical rotation of the probe beam in the vapor cell.

In an example embodiment, the pump beam light intensity modulation part may include an electro-optical modulator driver adapted to receive an output signal of the detector to output the driving signal; an electro-optical modulator adapted to receive the driving signal to change a polarization state of pump bema; and a polarization beam splitter adapted to extract a specific polarization component from the pump beam passing through the electro-optical modulator.

Embodiments of the present invention provide an operating method of an atomic magnetometer. In an example embodiment, the operating method may include providing a circularly polarized pump beam and a linearly polarized probe beam to a vapor cell containing an alkali metal vapor under a measurement magnetic field established by a measurement target; detecting a polarization rotation signal from the linearly polarization probe beam passing through the vapor cell according to a polarization state of the probe beam by using a detector; and negatively feedback-controlling the intensity of a circularly polarized pump beam by using the polarization rotation signal.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION

Figure 1:
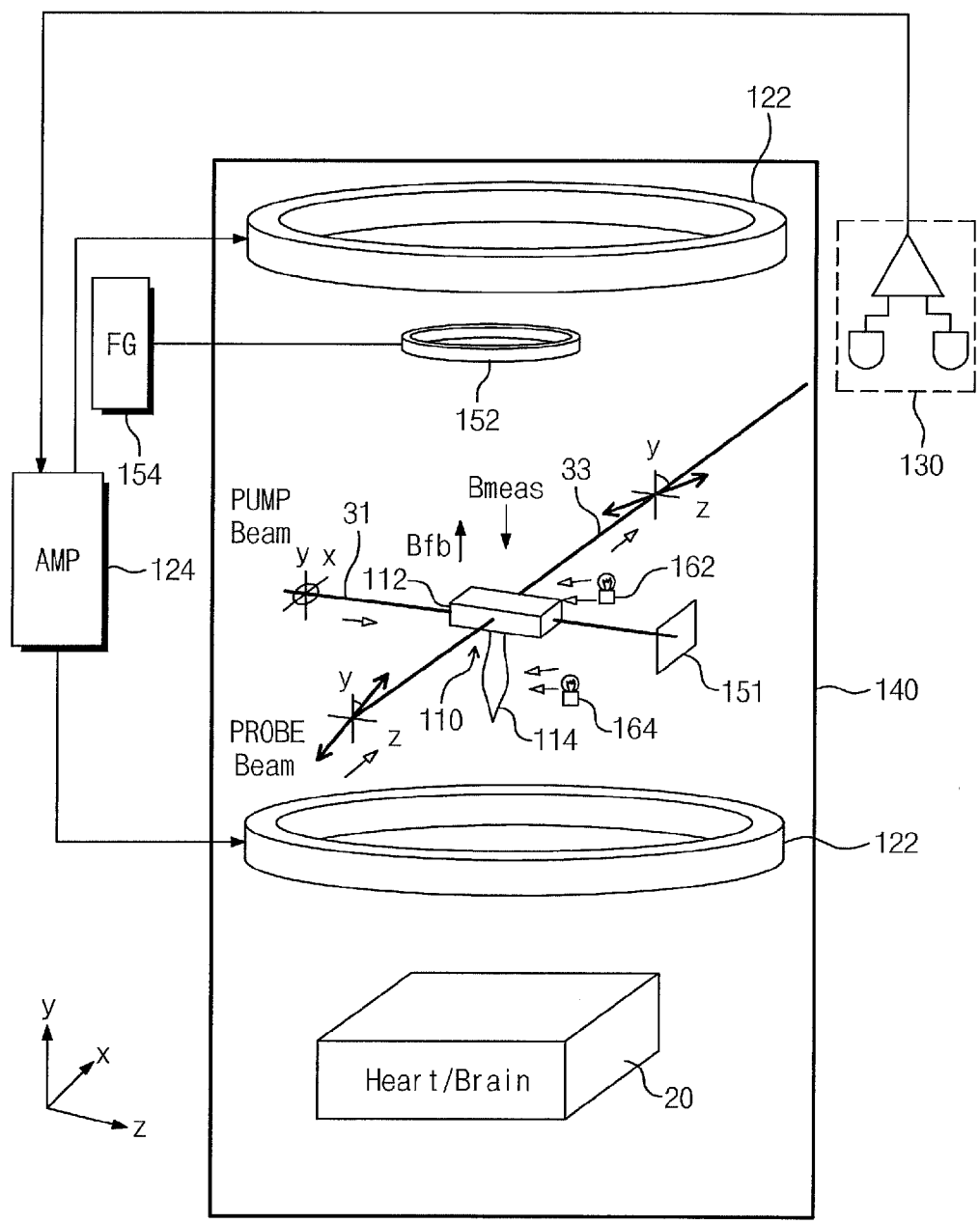
FIG. 1 is a conceptual diagram of an atomic magnetometer according to an embodiment of the present invention.

A study on an optical magnetometer using light has been vigorously made as a method for overcoming limitations of SQUIDs. In the field of the optical magnetometer, a study made up to the present time may be roughly summarized in two directions as follows: (1) a method of measuring the degree of refractive index variation of a medium caused by a magnetic field and (2) a method of measuring the degree of shift of a magnetic sublevel. The former is called an optical pumping magnetometer (OPM), and the latter is called a coherent population trapping magnetometer (CPTM).

The principle of a basic atomic magnetometer is that a Larmor precession frequency of an atomic spin is measured under a magnetic field to measure an external magnetic field.

Sensitivity of an atomic magnetometer is decided by linewidth and nose of a measured signal. There are two ways to improve the sensitivity of an atomic magnetometer.

One ways is to prevent atoms from colliding against a wall surface of a vapor cell including the atoms. This way mainly uses a vapor cell including a buffer gas and a vapor cell coated with paraffin. In general, a factor having the most influence on coherent time between ground levels of alkali atoms is collision between a wall surface of a vapor cell and atoms. A buffer gas mainly employs molecules, such as He and $N_2$, which have no influence on change of a coherent state even when they collide against alkali atoms. The buffer gas prevents the alkali atoms from diffusing to the wall surface of the vapor cell and serves to increase time of interaction between the alkali atoms and probe beam.

The other ways is to increase atom population. If the atom population increases, sensitivity of an atomic magnetometer is decided by spin-exchange collision of alkali atoms. In this case, spin of atoms is preserved but atomic coherency is relaxed.

In recent, a spin exchange relaxation method has been known as a method of completely eliminating relaxation cause by spin-exchange collision between ground levels. A SERF magnetometer is a representative OPM. If a Larmor frequency is much smaller than spin exchange speed between atoms under a weak magnetic field, relaxation caused by spin exchange may be reduced. Under this structure, atoms are precessed in the same direction of precession direction of each atom but a precession frequency is precessed with an average frequency. That is, a precession frequency of atoms is made slower than a precession frequency of each atom and the atoms remain at an atomic level for a longer time. A magnetometer based on this method experimentally has sensitivity of 0.54 fT/Hz$^{1/2}$ and theoretically has sensitivity of 0.01 fT/Hz$^{1/2}$.

In recent, an atomic magnetometer has been developed using a vapor cell manufactured with a size of a micrometer unit whose volume is about 10 mm$^3$. These devices are easily movable and require laser power that has small intensity of several mW. A size of the overall device is smaller than 10 cm$^3$.

In an atomic magnetometer, a magnetization (e.g., magnetic momentum) of atoms aligned in a fixed direction may change due to pump beam. In this case, a magnetization state of atoms may be understood by measuring the degree of polarization rotation of probe beam. That is, by measuring a polarization rotation angle of the probe beam or by measuring a state of atoms for a magnetic field, the magnetic field is measured. In general, directions of the pump beam and the probe beam are orthogonal to each other. However, since circular polarization components having opposite rotation directions of linearly polarized light are used as pump beam and probe beam in a CPT-based structure, directions of the two lights are identical to each other.

Coherent relaxation caused by spin relaxation must be minimized to improve sensitivity to an external magnetic field. The spin relaxation includes relaxation caused by spin-exchange collision, spin-destruction relaxation, and relaxation caused by collision against a wall surface of a glass container containing a coherent medium. At a high atomic density, spin-exchange collision between coherent populations makes the biggest contribution to spin relaxation. In this collision, a spin direction of two atoms varies depending on whether a spin can be distinguished. However, the total momentum is conserved.

This effect is due to the fact that interaction between alkali-alkali metal used as coherent media in an experiment has spin singlet and triplet potentials. A significantly great energy difference between the singlet potential and the triplet potential leads to a phase difference of a wavefunction in collision between alkali metal atoms. As a result, spin-state exchange of the atoms occurs. Since the spin-exchange collision occurs very fast during interaction between hyperfine atomic levels, the spin-exchange collision has no influence on a nuclear spin of the colliding atoms. However, atoms exchange hyperfine states due to their collision. That is, the atoms are redistributed between Zeeman magnetic sublevels due to the spin-exchange collision. Since two ground levels are equal in frequency and opposite in precession at hyperfine energy of atoms, coherent relaxation between two hyperfine energies occurs. However, when the density of atoms is high under a sufficiently small magnetic field, i.e., a spin-exchange rate is sufficiently greater than a precession frequency, each of the atoms may make a precession at a very small angle. Thus, all atoms in a Zeeman magnetic sublevel of the ground level have a very small frequency. For a relatively longer time, atoms stay at an $F=I+1/2$ level in which there is a relatively more Zeeman sublevel. Especially, atoms are polarized at an $mF=I+1/2$ magnetic sublevel of the $F=I+1/2$ level, so that all the atoms make a precession with the same direction and the same frequency. Through this method, atoms of two hyperfine levels make a precession and spin-exchange collision does not have an influence on spin relaxation any longer.

A small magnetic field of several nT and high density of a medium are required to eliminate the spin-exchange relaxation. Furthermore, except for a measurement-target magnetic field, there must be no magnetic field around a vapor cell. In order to establish the magnetic field of several nT, a magnetic field around a medium within a magnetic field shielding device must be adjusted to be close to 0 Tesla (T) by forming a magnetic field compensation coil in a direction orthogonal to a laser propagation plane. Further, in order to establish the magnetic field of several nT, a magnetic field around a medium within a magnetic field shielding device must be adjusted to be close to 0 T by forming a magnetic field compensation coil in a direction horizontal to a laser propagation plane.

High temperature is required to increase the density of a vapor-state medium. Potassium atoms used in an experiment are alkali metal atoms, and spin-exchange collision sufficiently occurs at a temperature of about 200 degrees centigrade. A proper condition of the spin-exchange collision is decided by a collisional cross-section area between atoms and am atom density depending on temperature. A collisional cross-section area of potassium atoms is $1\times10^{-18}$ cm$^2$, and required density is $10^{14}$-$10^{15}$ cm$^{-3}$.

According to an embodiment of the present invention, a temperature control method of a temperature control device uses a method of generating heat by applying alternating current (AC) to a resistor between 5 kHz to 30 kHz. A magnetic field established by the current of the temperature control device is a magnetic field between 5 KHz and 30 KHz. However, there is substantially no influence in the band between 5 kHz and 30 kHz due to a low frequency response of a vapor cell. Accordingly, an AC resistance line heating method may dramatically reduce a space as compared to a temperature control method using a conventional heating fluid. In addition, the vapor cell requires a heat insulation device to maintain a temperature. The heat insulation device may be readily disassembled and assembled through insertion and combination using a PTFE material.

Among various atomic magnetometers, the SERF magnetometer is a most promising type of atomic magnetometer for measuring a biomagnetism. By completely eliminating relaxation caused by spin-exchange collision, the SERF magnetometer may reach sensitivity of 0.1 fT/Hz$^{1/2}$. However, long spin-coherent time of the SERF magnetometer limits bandwidth of the magnetometer.

Various ways to extend bandwidth of an atomic magnetometer have been reported. A self-oscillating magnetometer feeds back modulation power to a light source to have bandwidth above 1 kHz. Bandwidth having a high-density atomic cell and reaching bandwidth of 10 kHz may be obtained by increasing an optical pumping rate. However, this system has low sensitivity of about 10 fT/Hz$^{1/2}$. Thus, this system cannot measure a weak biomagnetic signal such as MEG of a human body.

In recent, a negative feedback principle has been applied to a radio frequency (RF) atomic magnetometer. It has been reported that bandwidth extends by 1 kHz or more from 423 kHz.

Under the negative feedback, suppression of spin coherent time is concerned with spin damping. The RF atomic magnetometer having spin damping exhibits sensitivity of 0.3 fT/Hz$^{1/2}$. However, a center frequency must access direct current (DC) for actual application to sense a time-varying biomagnetic field. Unfortunately, this system cannot be compatible with the RF atomic magnetometer.

According to an embodiment of the present invention, the SERF-based high-density atomic magnetometer is disclosed. In order to increase sensitivity of a magnetic field and ensure a frequency area for precise measurement of MEG/MCG, negative feedback is provided to a vapor cell in which alkali metal vapor is contained. In addition, the negative feedback reduces a signal-to-noise ratio and provides wide bandwidth to measure a magnetic field signal that is low in intensity and varies fast.

According to an embodiment of the present invention, use of negative feedback is proposed which is capable of extending detection bandwidth of an atomic magnetometer in the SERF regime.

According to an embodiment of the present invention, when negative feedback is used, a flat-frequency response from zero to 190 Hz is achieved. The flat-frequency response is maintained at a noise level of 3 fT/Hz$^{1/2}$ at a frequency of 100 Hz and increase three times larger than when the negative feedback is not used.

As the bandwidth extends, a linear correlation between magnetocardiographic fields synthesized to compare with a detection signal increases from 0.21 to 0.74. This result shows feasibility to detect weak biomagnetic signals including multiple frequency components.

According to an embodiment of the present invention, we applied negative feedback to the SERF-based atomic magnetometer. The three-times increase of the bandwidth almost results in a flat-response in a frequency domain from DC to 190 Hz. A noise level was measured to be 3 fT/Hz$^{1/2}$ at a frequency of 100 Hz. The noise level is similar to that of a DC SQUID.

It may be assumed that the overall system of the SERF atomic magnetometer is an amplifier having a mono pole at a frequency response. A signal detected under negative feedback exhibited a high correlation coefficient.

Preferred embodiments of the present invention will now be described more fully with reference to the accompanying drawings. In the drawings, like reference numerals represent like elements, and sizes of elements are exaggerated for clarity of illustration.

FIG. 1 is a conceptual diagram of an atomic magnetometer according to an embodiment of the present invention.

Figure 2A:
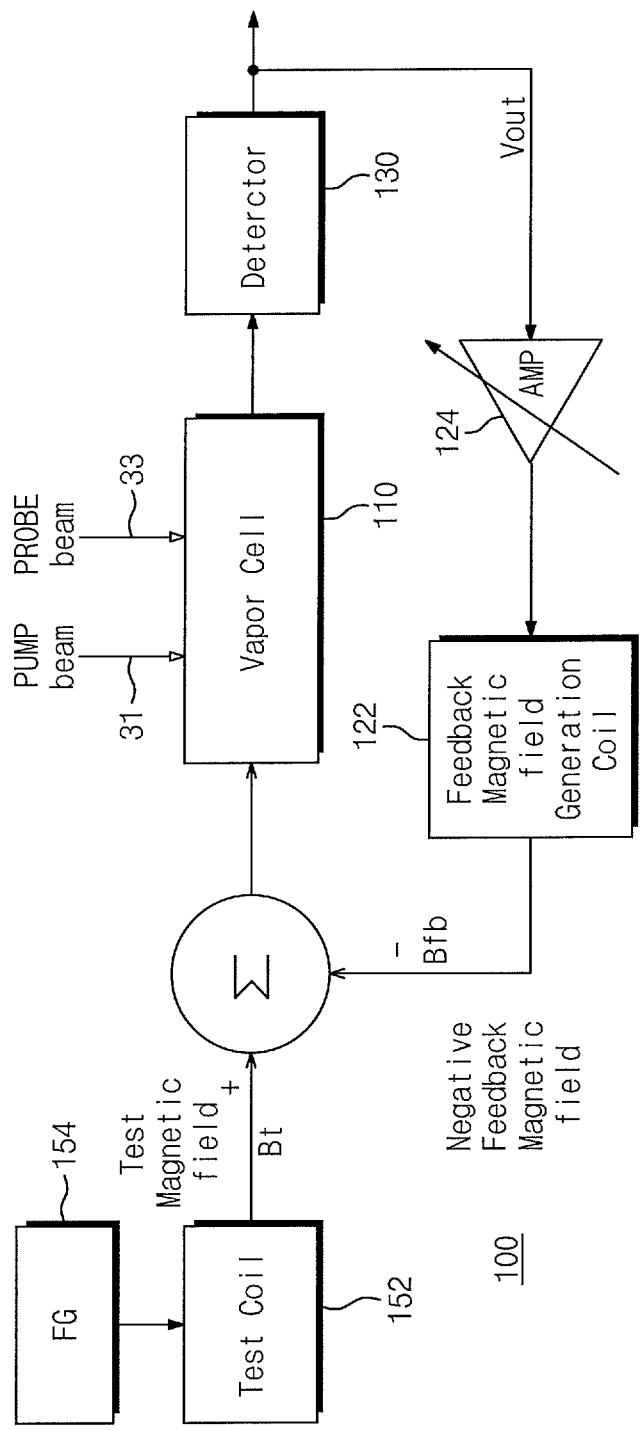
FIG. 2A is a block diagram illustrating negative feedback of the atomic magnetometer in FIG. 1 under a test magnetic field.

FIG. 2A is a block diagram illustrating negative feedback of the atomic magnetometer in FIG. 1 under a test magnetic field.

Figure 2B:
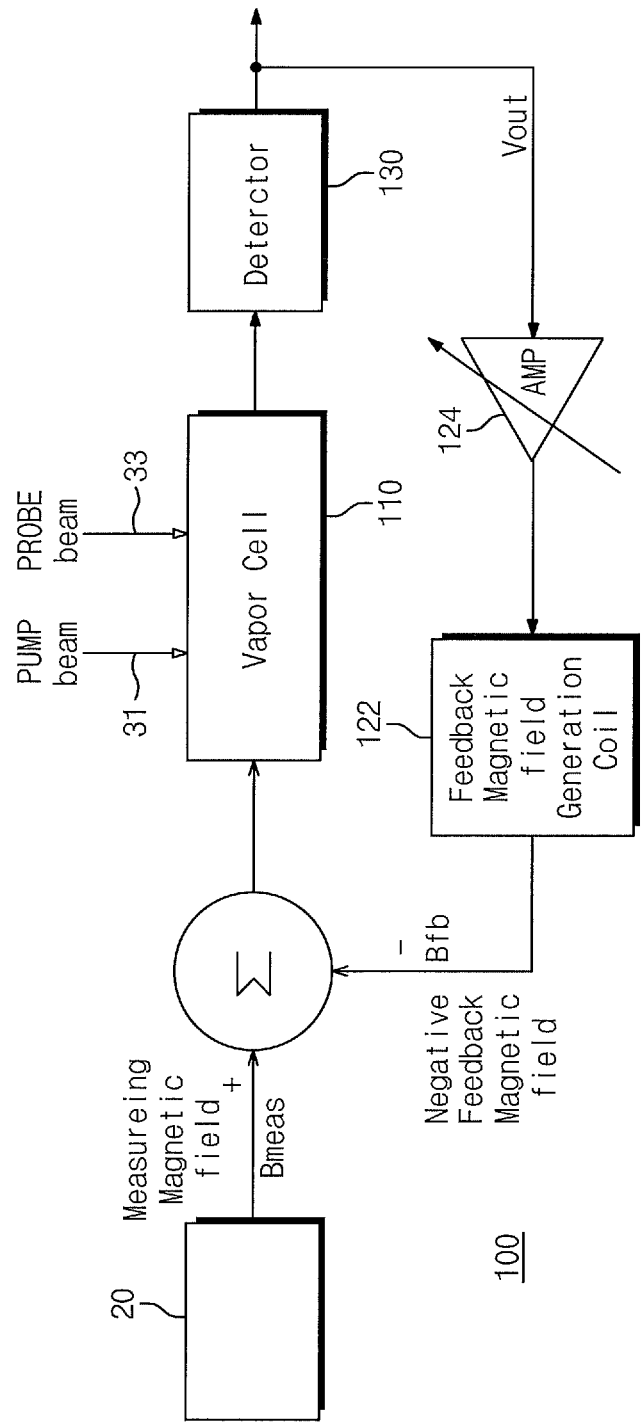
FIG. 2B is a block diagram illustrating negative feedback of the atomic magnetometer in FIG. 1 under a measuring magnetic field.

FIG. 2B is a block diagram illustrating negative feedback of the atomic magnetometer in FIG. 1 under a measuring magnetic field.

Figure 3:
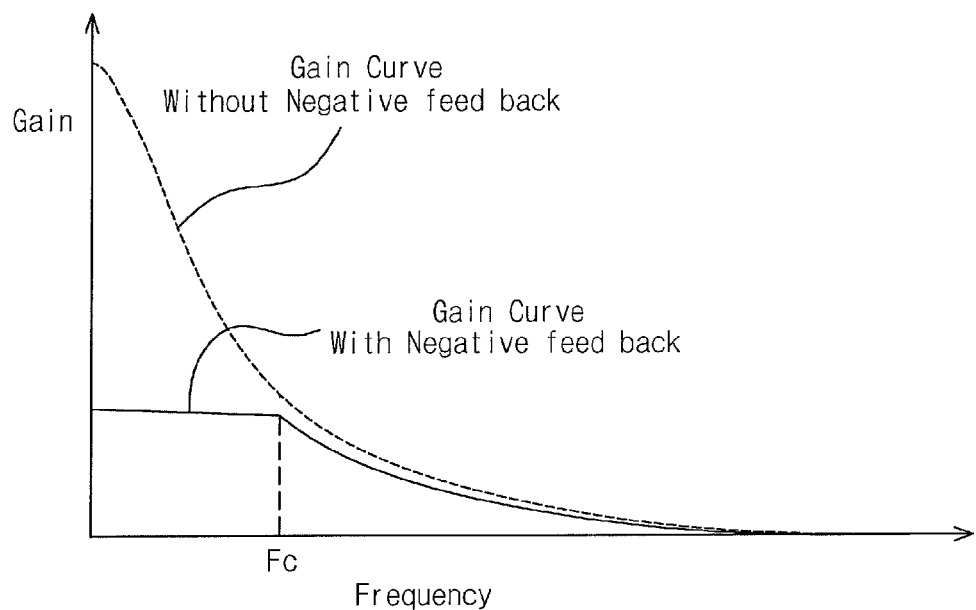
FIG. 3 illustrates a frequency response of the atomic magnetometer in FIG. 1.

FIG. 3 illustrates a frequency response of the atomic magnetometer in FIG. 1.

Referring to FIGS. 1 to 3, an atomic magnetometer 100 includes a vapor cell 110, a detector 130, a feedback coil 122, and a feedback amplifier 124.

The vapor cell 110 receives circularly polarized pump beam 31 and linearly polarized probe beam 33 and includes alkali metal vapor. The detector 130 receives the probe beam 33 passing through the vapor cell 110 to measure magneto-optical rotation of the probe beam 33. The feedback coil 122 is vertically spaced apart from a first plane (x-z plane) defined by travelling directions of the probe beam and the pump beam to generate and provide a negative feedback field signal $B_{fb}$ orthogonal to the first plane to the vapor cell 110. The feedback amplifier 124 receives an output signal of the detector 130 such that feedback current is supplied to the feedback coil 122 to establish the negative feedback field $B_{fb}$ proportional to a measurement magnetic field $B_{meas}$. The measurement magnetic field $B_{meas}$ of a measurement target 20 provides magneto-optical rotation of the probe beam in the vapor cell 110.

The measurement target 20 may be the heart or brain of a human body or a small animal such as mouse. The measurement magnetic field may be an MCG signal or an MEG signal. The measurement target 20 may be disposed inside a magnetic shielding part 140.

The vapor cell 110 contains a potassium (K) vapor, a helium (He) buffer gas, and an $N_2$ gas. Density of the K vapor is $1 \times 10^{13}$ cm$^{-3}$. Density of the helium buffer gas is 2.5 amg, and a vapor pressure of the $N_2$ gas is 15 Torr. The helium buffer gas decreases a rate of diffusing atoms to a wall. The $N_2$ increases efficiency of optical pumping through quenching.

The vapor cell 110 includes two parts, i.e., a main cell 112 and a stem cell 114. The main cell 112 is a borosilicate glass and is connected to the stem cell 114. The stem cell 114 acts as a vapor reservoir. The stem cell 114 is an aluminosilicate glass and prevents potassium vapor from being adsorbed to an inner surface of the stem cell 110.

Heating parts 162 and 164 include a first heating part 162 to heat the main cell 112 and a second heating part 164 to heat the stem cell 114. The heating parts 162 and 164 are used to suppress deposition of the potassium vapor. The main cell 112 is heated at a temperature of 200 degrees centigrade, and the stem cell 114 is heated at a temperature of 185 degrees centigrade. A difference in temperature between the stem cell 114 and the main cell 112 is automatically maintained through PID control. The first heating part 162 and the second heating part 164 may include a resistive heater. The heating parts 162 and 164 may be thermally insulated by a thermal insulating panel.

A pump beam light source may output the pump beam 31. The pump beam light source may include distributed feedback laser (DFB laser).

The pump beam light source may transfer the pump beam 31 of linear polarization to the vapor cell 110 through a polarization maintaining fiber of a single mode $TEM_{00}$. A wavelength of optical pumping matches the center of a potassium D1 (K D1) line. Power of the pump beam may be amplified to 1 W by a tapered amplifier. A diameter of the pump beam may extend to 5 mm through a pair of lenses. The pump beam 31 may travel in the z-axis direction.

A probe light source may output a probe beam 33. The probe beam 33 may be generated by a single mode DFB laser. The probe beam may be monitored by a Fabry-Perot interferometer and a spectrometer. A linearly polarized probe beam may travel in the x-axis direction to be provided to the vapor cell. Wavelength of the probe beam is maintained after evading from several nanometers (nm) on the K D1 line to minimize absorption. The probe beam may be provided to the detector 130 after passing through a half wave plate and the vapor cell 110. The detector 130 may include a balanced polarimeter. The balanced polarimeter may include a polarization beam splitter and a pair of photodiodes. The polarization beam splitter splits the probe beam into two paths according to orthogonal polarization. A differential amplifier measures a difference between polarization signals orthogonal to each other.

A test coil 152 establishes a test magnetic field $B_t$. The test coil 152 may be a circular coil having a plurality of windings. The test magnetic fields $B_t$ includes a oscillating signal with multiple frequencies. The test coil 152 generates the test magnetic field $B_t$ instead of the measurement magnetic field of the measurement target. The test coil 152 may be used for correction and test before measuring a measurement target. The test coil 152 may be disposed on the vapor cell 110 in the y-axis direction. The test coil 152 may be connected to a function generator 154 generating an arbitrary waveform. The function generator 154 may generate a virtual MCG signal.

The feedback coil 122 may include a Helmholtz coil of the y-axis direction. The feedback coil 122 may receive an output of the detector 130 to generate a negative feedback field $B_{fb}$ of a direction opposite to the direction of the measurement magnetic field $B_{meas}$. The negative feedback field $B_{fb}$ may be antiparallel to the measurement magnetic field $B_{meas}$.

The feedback amplifier 124 receives and amplifies an output signal of the detector 130 to provide current to the feedback coil 122. The feedback amplifier 124 may output current proportional to an input voltage. The negative feedback field $B_{fb}$ may be in proportion to the output current of the feedback amplifier 124. The feedback amplifier 124 may be an audio amplifier to amplify a bandwidth of 50 kHz or less. Conventionally, frequency bandwidth of a biomagnetic signal is 200 Hz or less. Therefore, the feedback amplifier 124 may have a flat frequency response at several kHz or less.

The negative feedback magnetic filed $B_{fb}$ may be given, as below.

$$B_{fb} = \beta V_{out} \hspace{4em} \text{Equation (1)}$$

In the Equation (1), β represents a feedback gain and Vout represents an electric signal at an output terminal of the detector 130. The output signal Vout of the detector 130 may be in proportion to a polarization rotation angle of a probe beam. Alternatively, the output signal Vout of the detector 130 may be in proportion to magneto-optical rotation of the probe beam.

Referring to FIG. 3, as the atomic magnetometer 100 has a negative feedback, a gain curve of the magnetometer 100 is made flat and a gain decreases. Thus, linearity of an output of the negative feedback atomic magnetometer 100 may increase. That is, increase in the linearity of the output may extend characteristic bandwidth. The characteristic bandwidth may be in proportion to a cut-off frequency.

Increase in the linearity of the output of the atomic magnetometer may be interpreted under the assumption that the atomic magnetometer 100 is a single-pole amplifier. Assuming that the atomic magnetometer 100 is the single-pole amplifier, an input of a virtual amplifier may be the measurement magnetic field $B_{meas}$ and an output thereof may be the output signal Vout of the detector 130. The unit of an open-loop gain G of the virtual amplifier may be V/n.

Like other systems possessing resonances, the SERF atomic magnetometers exhibit a Lorentzian-type response in the frequency domain, which has a center frequency of nearly zero and a cut-off frequency $f_C$. Therefore, the open-loop gain G may be expressed in terms of a Lorentzian form, as below.

$$G = \frac{G_0}{1 + j\frac{f}{f_c}} \quad \text{Equation (2)}$$

In the Equation (2), $G_0$ represents a DC gain, f represents a frequency, and $f_C$ represents a cut-off frequency.

Under a negative feedback situation, a feedback gain $G_{fb}$ may be expressed, as below.

$$G_{fb} = \frac{G_0}{1 + \beta G_0 + \left(1 + j\frac{f}{(1 + \beta G_0)/f_c}\right)} \quad \text{Equation (3)}$$

In the Equation (3), β represents a feedback gain parameter. A frequency response of the atomic magnetometer extends bandwidth to a factor (1+βG₀), and the bandwidth extension decreases the DC gain to the factor (1+βG₀). The bandwidth extension is caused by flat frequency characteristics, which may measure an input signal (measurement magnetic field) without distortion.

The feedback gain parameter β may be suitably selected according to a frequency bandwidth of a measurement magnetic field. The feedback gain parameter β may be adjusted by controlling the gain of the feedback amplifier.

In an application to measure a pulse-type magnetic field exhibiting strong higher-order harmonics, the extended bandwidth improves linearity of an output signal of the atomic magnetometer 100. Therefore, a reduced DC gain is not an important shortcoming. A signal-to-noise ratio of a system decides an upper limit of extension factor (1+βG₀).

Figure 4:
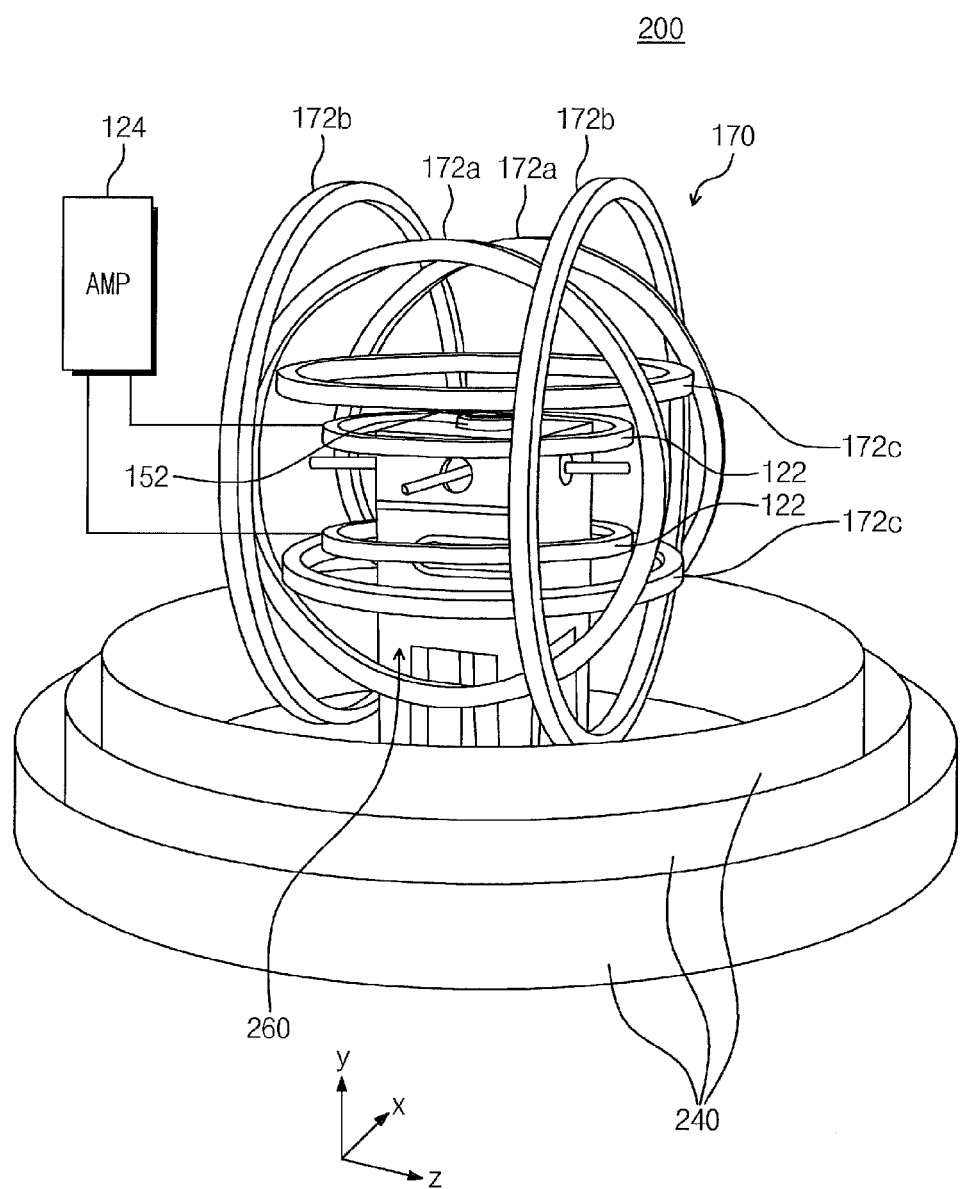
FIG. 4 is a perspective view of an atomic magnetometer according to another embodiment of the present invention.

FIG. 4 is a perspective view of an atomic magnetometer according to another embodiment of the present invention.

Figure 5:
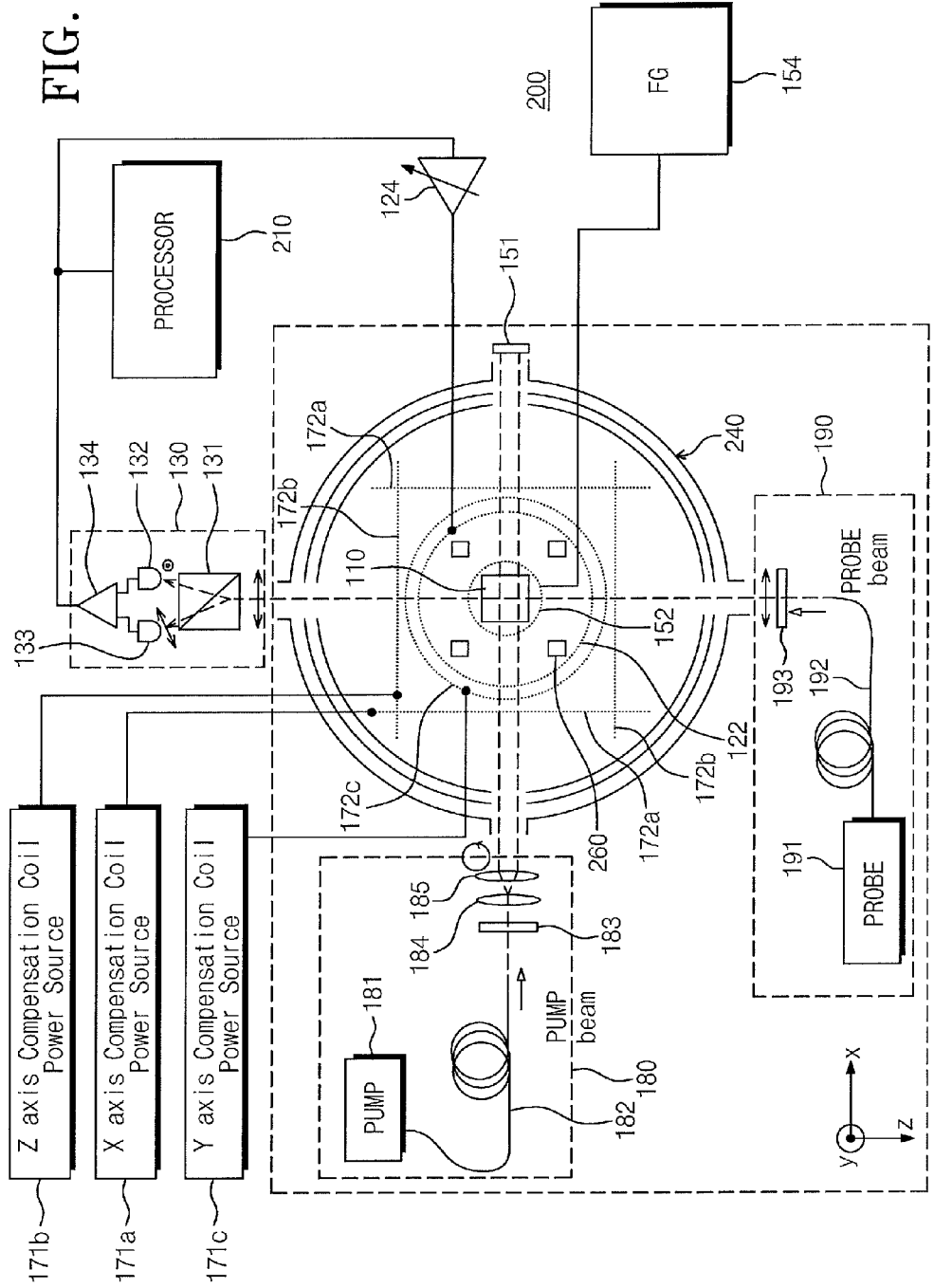
FIG. 5 is a top plan view of the atomic magnetometer in FIG. 4.

FIG. 5 is a top plan view of the atomic magnetometer in FIG. 4.

Figure 6:
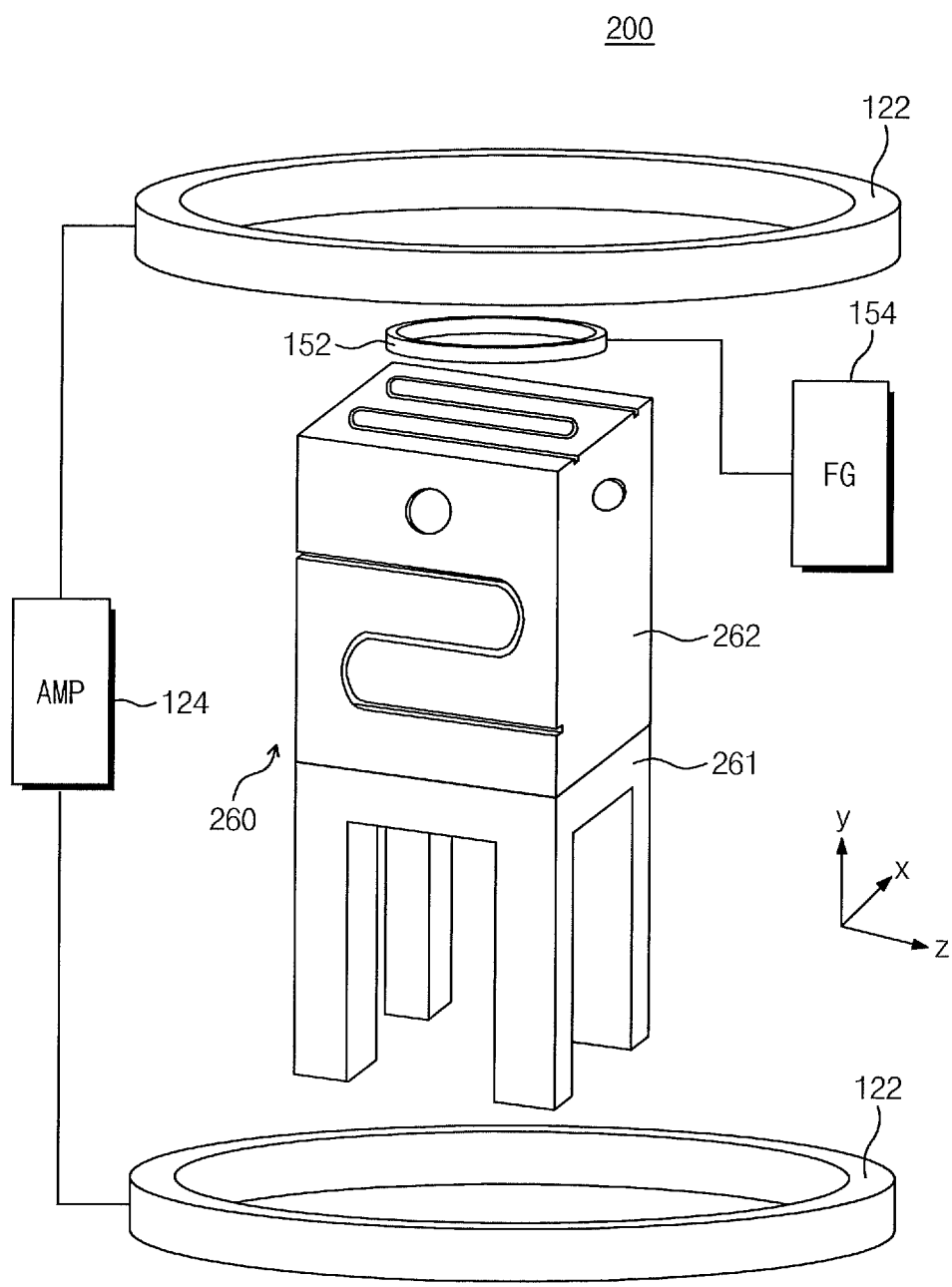
FIG. 6 is a perspective view of an insulation block of the atomic magnetometer in FIG. 4.

FIG. 6 is a perspective view of an insulation block of the atomic magnetometer in FIG. 4.

Figure 7:
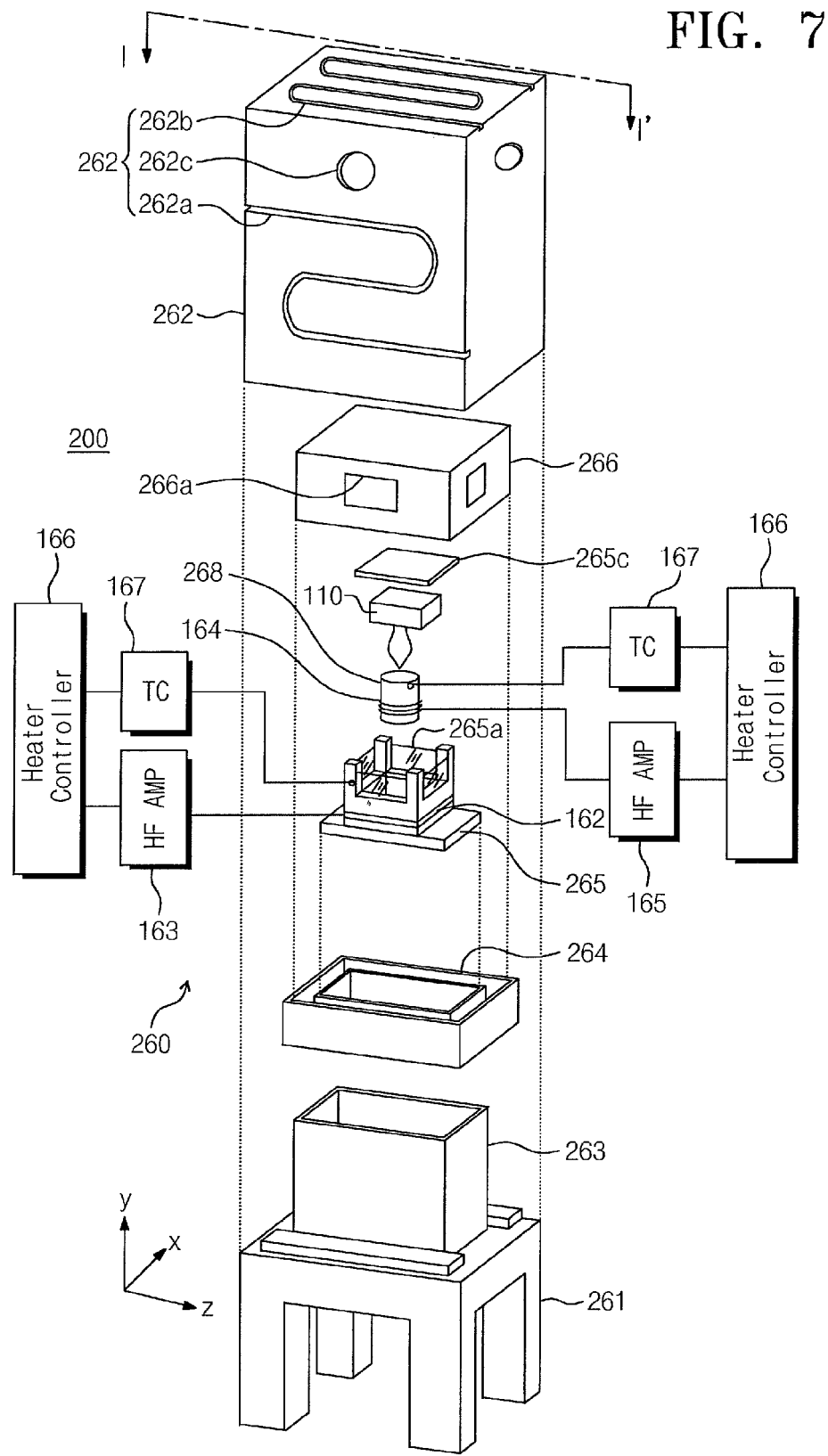
FIG. 7 is an exploded perspective view of the insulation block in FIG. 6 and a heating block inside the insulation block.

FIG. 7 is an exploded perspective view of the insulation block in FIG. 6 and a heating block inside the insulation block.

Figure 8:
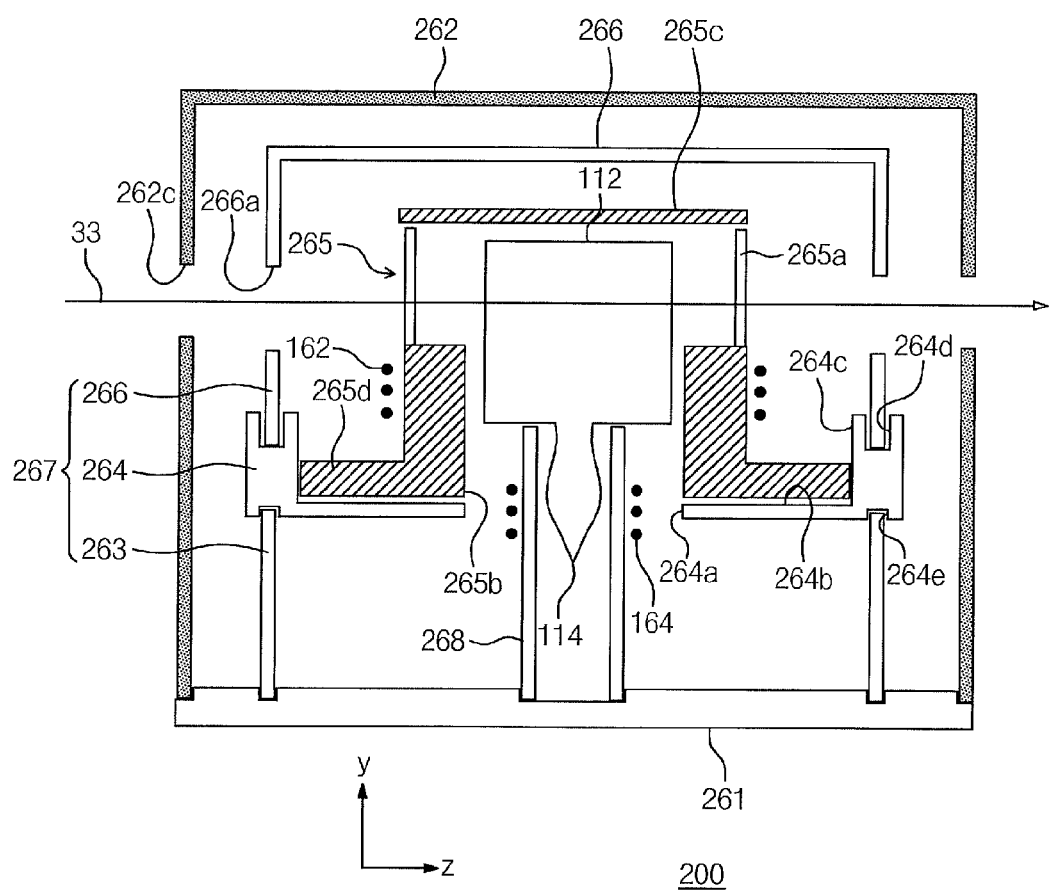
FIG. 8 is a cross-sectional view taken along the line I-I' in FIG. 7.

FIG. 8 is a cross-sectional view taken along the line I-I' in FIG. 7.

Figure 9:
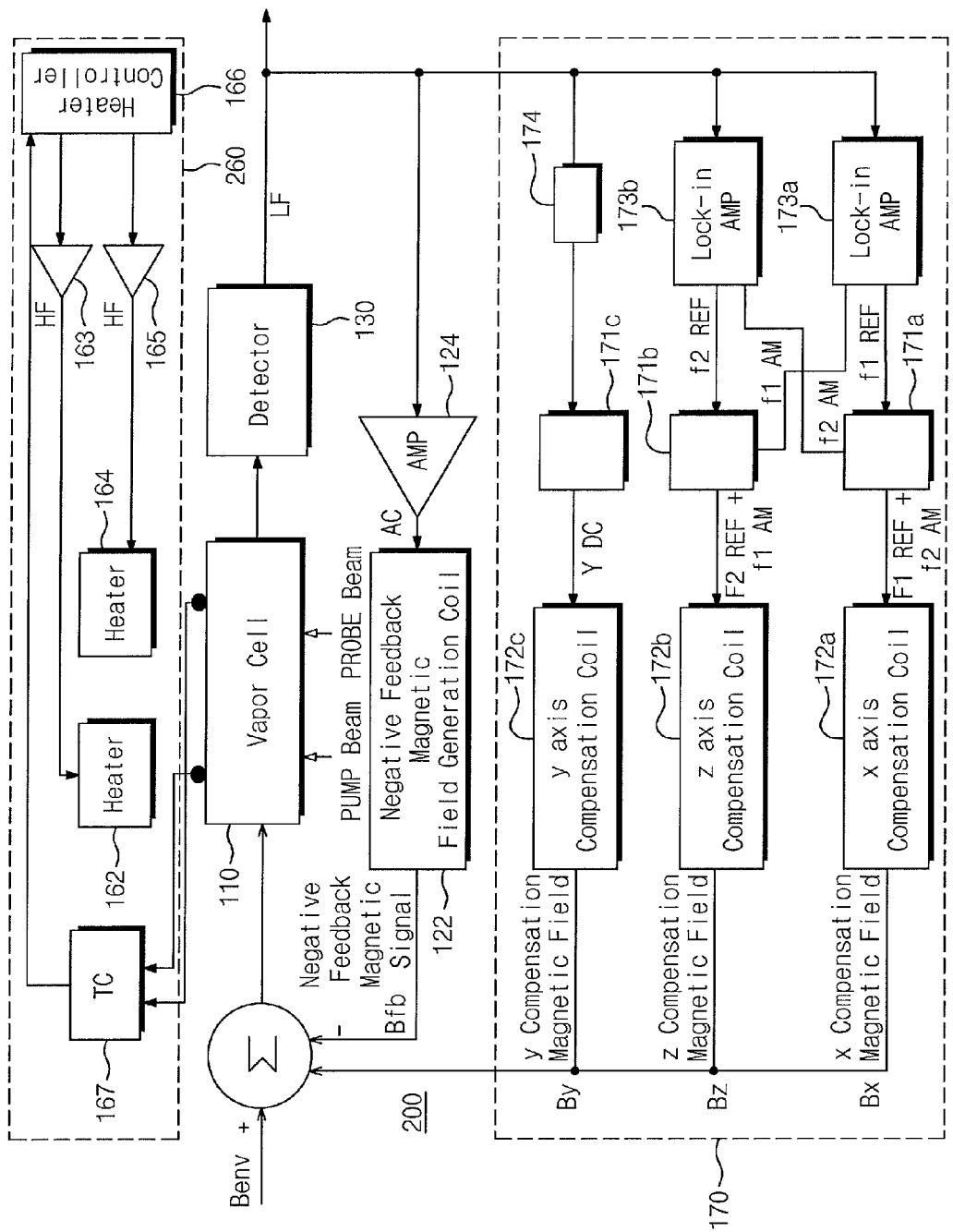
FIG. 9 is a block diagram illustrating compensation of a residual magnetic field.

FIG. 9 is a block diagram illustrating compensation of a residual magnetic field.

Figure 10:
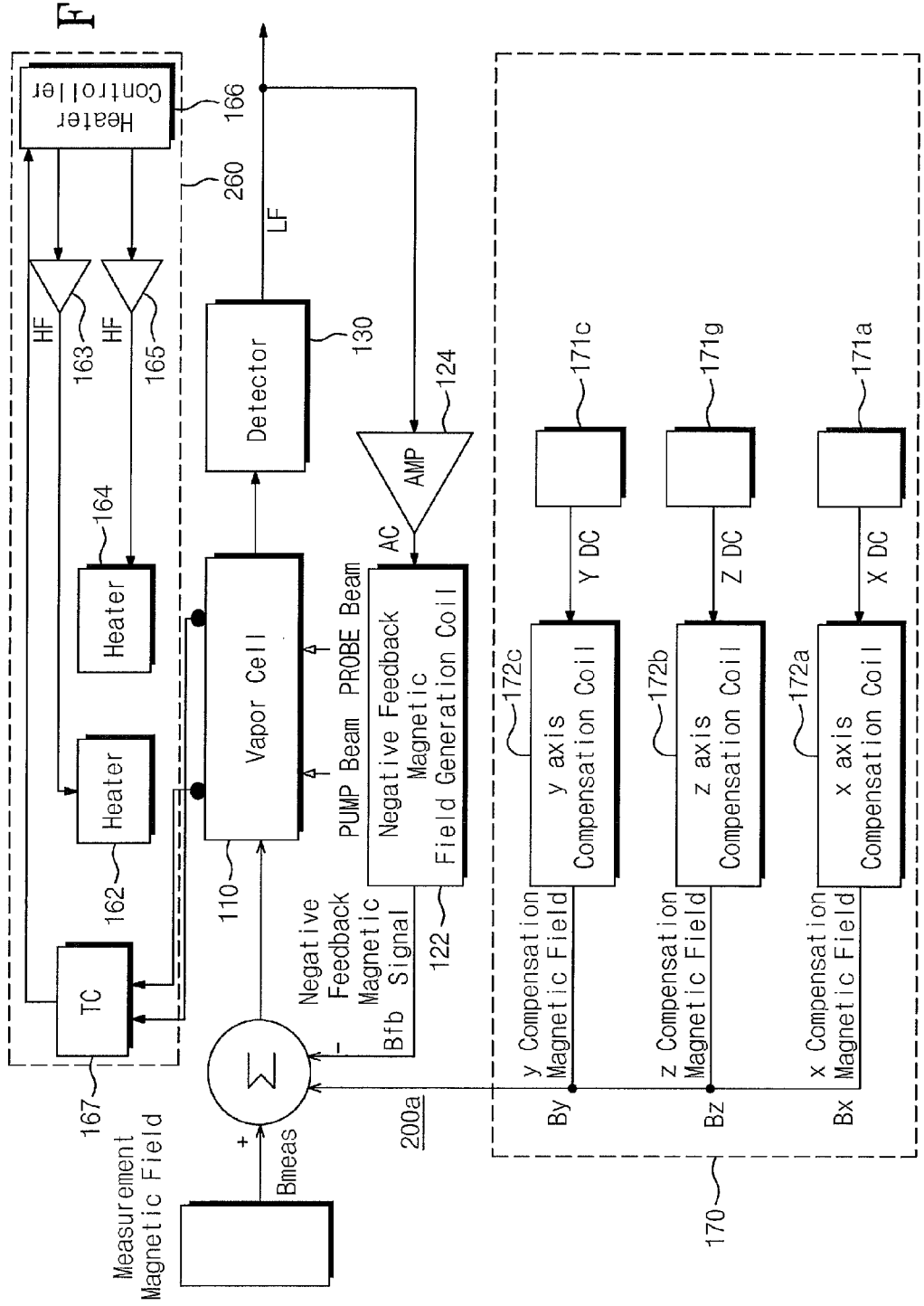
FIG. 10 is a block diagram illustrating measurement of a measuring magnetic field of a measuring target.

FIG. 10 is a block diagram illustrating measurement of a measuring magnetic field of a measuring target.

Referring to FIGS. 4 to 9, an atomic magnetometer 200 includes a vapor cell 110, a detector 130, a feedback coil 122, and a feedback amplifier 124. In FIGS. 4 to 9, sections different from FIGS. 1 and 3 will be extensively described to avoid duplicate description.

The vapor cell 110 receives a circularly polarized pump beam 31 and a linearly polarized probe beam 33 and includes an alkali metal vapor. The detector 130 receives the probe beam passing through the vapor cell 110 to measure magneto-optical rotation of the probe beam. The feedback coil 122 generates a negative feedback magnetic field signal orthogonal to a first plane defined travelling directions of the probe beam and the pump beam and provides the negative feedback magnetic field signal to the vapor cell 110. The feedback amplifier 124 receives an output signal of the detector 130 to provide feedback current to the feedback coil 122 such that the negative feedback magnetic field is established. A measurement magnetic field $B_{meas}$ of a measurement target 20 provides magneto-optical rotation of the probe beam in the vapor cell 110.

A magnetic shielding part 240 is made of a magnetic substance disposed around the vapor cell 110 to reduce an external environmental magnetic field. The magnetic shielding part 240 may include a three-folded cylinder Mu-metal chamber. The Mu-metal may be a nickel-iron alloy. The Mu-metal chamber minimizes the effect of an external magnetic field including the earth's magnetic field. After magnetic shielding with the M-metal chamber, a residual magnetic field inside the Mu-metal chamber may be about 0.15 nT in the x-axis direction and the z-axis direction and may be about 3 nT in the y-axis direction.

The magnetic shielding part 240 may be disposed to cover the vapor cell 110, a heating part 260 disposed to the vapor cell 110, and magnetic field compensation coils 172a, 172b, and 172c disposed to cover the heating part 260, and the feedback coil 122.

The magnetic shielding part 240 may have a pair of through-holes in the x-axis direction. The pump beam may travel in the x-axis direction. An absorber 151 to absorb the pump beam may be disposed at the back end of one of the through-holes in the x-axis direction.

In addition, the magnetic shielding part 240 may have a pair of through-holes in the z-axis direction. The probe beam may travel in the z-axis direction. The detector 130 to detect the pump beam may be disposed at the back end of one of the through-holes in the z-axis direction.

Since the application of a biomagnetic measuring technique using the atomic magnetometer 200 uses a high-sensitivity atomic magnetometer, it is necessary to eliminate noise caused by an external environment magnetic field. In particular, since the magnitude of the earth's magnetic field is about hundreds of milligauss (mG), it may have a serious effect on magnetic field measurement using an atomic magnetometer. The magnetic shielding part 240 may have a structure of a magnetic shielding container made of a magnetic substance.

A residual magnetic field may exist inside the magnetic shielding container, and an absolute zero magnetic field is required in the SERF regime. Accordingly, a magnetic field compensation coil system including a plurality of independent coils inside the shielding container for shielding a zero magnetic field may be constructed to establish not only a zero magnetic field but also a gradient magnetic field and a uniform magnetic field of several directions.

An active magnetic shielding technique may be applied to remove spin-exchange relaxation. A magnetic field compensation part 170 may be disposed around the vapor cell 110 to establish a compensation magnetic field such that a residual magnetic field remaining after being removed by the magnetic shielding part 240 is removed.

The magnetic field compensation part 170 may include an x-axis compensation coil 172a to establish an x-axis compensation magnetic field, an x-axis compensation power source 171a to provide current to the x-axis compensation coil 172a, a z-axis compensation coil 172b to establish a y-axis compensation magnetic field orthogonal to the x-axis compensation magnetic field, a z-axis compensation power source 171b to provide current to the z-axis compensation coil 172b, a y-axis compensation coil 172c to establish a y-axis compensation magnetic field orthogonal to a first plane, and a z-axis compensation power source 171c to provide DC current to the y-axis compensation coil.

The magnetic field compensation part 170 may further include one of an x-axis lock-in amplifier 173a receiving an output signal Vout of the detector 130 as an input to extract and output the first reference frequency component f1 AM, a z-axis lock-in amplifier 173b receiving the output signal Vout of the detector 130 as an input to extract and output a second reference frequency component f2 AM, and a low-pass filter 174 receiving the output signal Vout of the detector 130 as an input to extract a DC component.

The x-axis lock-in amplifier 173a may provide a first reference frequency signal f1 REF to the x-axis compensation power source 171a. The z-axis lock-in amplifier 173b may provide a second reference frequency signal f2 REF to the z-axis compensation power source 171b.

The x-axis compensation power source 171a may receive the first reference frequency signal f1 REF of the x-axis lock-in amplifier 173a and the second reference frequency component f2 AM of the z-axis lock-in amplifier 173b and modulate the second reference frequency component f2 AM with the first reference frequency signal f1 REF.

The z-axis compensation power source 171b may receive and module the second reference frequency signal f2 REF of the z-axis lock-in amplifier 173b and the first reference frequency component f1 AM of the x-axis lock-in amplifier 173a and modulate the first reference frequency component f1 AM with the second reference frequency signal f2 REF.

In this case, the first reference frequency component f1 AM of the x-axis lock-in amplifier 173a may be in proportion to a z-axis residual magnetic field component and the second reference frequency component f2 AM of the z-axis lock-in amplifier 173b may be in proportion to an x-axis residual magnetic field component.

The low-pass filter 174 may receive the output signal Vout of the detector 130 to extract a DC component. The DC component of the output signal Vout of the detector 130 may be in proportion to a y-axis residual magnetic field. Accordingly, the DC component of the output signal Vout of the detector 130 may be provided to the y-axis compensation power source 171c to compensate the y-axis residual magnetic field. The y-axis compensation power source 171c may output DC current proportional to an input signal to compensate the y-axis residual magnetic field.

Before measuring a measurement magnetic field that the measurement target 20 establishes, DC current Y DC of the y-axis compensation power source 172c, DC current X DC of the a-axis compensation power source 171a, and DC current Z DC of the z-axis compensation power source 172b may be set to compensate the y-axis residual magnetic field, the x-axis residual magnetic field, and the z-axis residual magnetic field.

The x-axis compensation coil 171a may be an x-axis Helmholtz coil. The x-axis compensation coil 171a may generate x-axis-directional magnetic field components and be spaced apart from each other in the x-axis direction. The y-axis compensation coil 171c may be a y-axis Helmholtz coil. The y-axis compensation coil 171c may generate y-axis-directional magnetic field components and be spaced apart from each other in the y-axis direction. The z-axis compensation coil 171b may be a z-axis Helmholtz coil. The z-axis compensation coil 171b may generate z-axis-directional magnetic field components and be spaced apart from each other in the z-axis direction.

The feedback coil 122 may be a Helmholtz coil disposed to be spaced in the y-axis direction. A coil system may include 3-axial Helmholtz coils. The coil system includes two pairs of y-axis cols (y-axis compensation coil and feedback coil), a pair of x-axis coils (x-axis compensation coil), and a pair of z-axis coils (z-axis coil). A single circular coil (test coil) may be disposed on the y-axis.

The magnetic field compensation part 170 includes 3-axial Helmholtz coils and may have symmetry axes orthogonal to each other and be wound on a circular frame. The 3-axis Helmholtz coil may be used to remove residual magnetic fields inside the magnetic shielding part 240. The magnetic field compensation part 170 may actively compensate an external environmental magnetic field or a residual magnetic field to establish a zero magnetic field. Thus, the operation environment of an SURF atomic magnetometer is constructed.

Before measuring the measurement target 20, the magnetic field compensation part 170 is corrected to establish the zero magnetic field. When the measurement magnetic field $B_{meas}$ is measured from the measurement target 20, output current of the y-axis compensation power source 171c is fixed to a constant value to compensate the y-axis static residual magnetic field. Output current of the x-axis compensation power source 171a is fixed to a constant value to compensate an x-axis static residual magnetic field. Output current of the z-axis compensation power source 171b is fixed to a constant value to compensate a z-axis static residual magnetic field. Accordingly, only the measurement magnetic field $B_{meas}$ established by the measurement target 20 is measured while the zero magnetic field is maintained.

Y-axis compensation current Y DC flowing to the y-axis compensation coil 171c, x-axis compensation current X DC flowing to the x-axis compensation coil 171a, and z-axis compensation current Z DC flowing to the z-axis compensation coil 171b may be measured to establish the zero magnetic field. Thus, in contrast, the y-axis compensation current Y DC, the x-axis compensation current X DC, and the z-axis compensation current Z DC may receive their compensation magnetic field components, respectively.

The compensation magnetic field components of the y-axis compensation current Y DC, the x-axis compensation current X DC, and the z-axis compensation current Z DC are provided to the vapor cell such that the residual magnetic field is made zero while the measurement magnetic field $B_{meas}$ of the measurement target 20 are measured.

The pump beam light source 190 may include a pump laser 181, an optical fiber 182 to guide pump beam of the pump laser 181, and a quarter wave plate 183, and a pair of convex lenses (184, 185). Output light of the pump laser 181 may be guided by the optical fiber 182. Output light of the optical fiber 182 may be in a linearly polarized state. Pump beam of the linearly polarized state may be provided to the quarter wave plate 183 to be converted into circularly polarized pump beam. The quarter wave plate 183 may convert linear polarization into circular polarization. A size of the circularly polarized pump beam may extend through the pair of convex lenses (184, 185). The extended pumping beam is provided to the vapor cell 110 in the x-axis direction.

The probe light source 190 may include a probe laser 191, an optical fiber 182 to guide probe beam of the probe laser 191, and a half wave plate 193. The probe beam passing through the optical fiber 192 may be linearly polarized beam. The half wave plate 193 may change a direction of linear polarization. The probe beam passing through the half wave plate 193 may be provided to the vapor cell 110 in the z-axis direction.

The detector 130 may include a polarization beam splitter 131, a first photodiode 132, a second photodiode 133, and a differential amplifier 134. The polarization beam splitter 131 may be a Wollaston prism to split beam according to a polarization state. The polarization beam splitter 131 may split beam according to a polarization state. The first photodiode 132 may measure the intensity of split first probe beam, and the second photodiode 133 may measure the intensity of split second probe beam. The differential amplifier 134 may amplify and output a difference between an output of the first photodiode 132 and an output of the second photodiode 133. A polarization rotation angle of the probe beam may be dependent on the output of the differential amplifier 134.

The feedback coil 122 may establish a feedback magnetic field $B_{fb}$ of the y-axis direction. The feedback coil 122 may be a Helmholtz coil spaced in the y-axis direction. The feedback coil 122 may be disposed at the inner side of the y-axis coil 171c.

The test coil 152 may be disposed inside the feedback coil 122 to establish a y-axis test magnetic field. The test coil 152 may generate an arbitrary waveform instead of the magnetic field that the measurement target 20 establishes. The test coil 152 may be mounted to test or correct the atomic magnetometer. The test coil 152 may be a circular coil.

An SERB method requires high atomic density. Therefore, a suitable temperature of potassium vapor is about 200 degrees centigrade. For this, a heating part and a thermal insulating part were provided. In a heating method, current was applied to a resistor using an ohmic heating manner to control a temperature. Current modulated with a high frequency of about 5 to 30 kHz was applied to prevent an induced magnetic field established by alternating current (AC) from having an effect on a state of potassium atoms. That is, since a cut-off frequency $f_C$ of the negative feedback atomic magnetometer is hundreds of hertz (Hz), high-frequency heating current of 5 to 30 kHz substantially does not have an influence on the negative feedback SERF magnetometer.

The heating part 260 may include a first heating block 265 disposed to cover the periphery of the main cell 112, a first heating coil 162 disposed to cover an outer circumferential surface of the first heating block 265, a second heating block 268 aligned with the through-hole 265b of the first heating block 265 and disposed to cover the periphery of the system cell 114, a second heating coil 164 disposed to cover the second heating block 268, and a thermally heating block 267 to store the first heating block 265. The first heating block 265 includes a through-hole 265b formed on its lower surface and a transparent window 265a formed on its side surface. The main cell 112 may be aligned with the transparent window 265a of the first heating block 265. The transparent window 265a may be a glass material.

The heating part 260 may include a first heating coil 162, a second heating coil 164, a temperature measuring part 167, audio amplifiers 164 and 165, and a temperature control part 166. The temperature measuring part 167 may include thermocouple. The temperature measuring part 167 may measure a temperature of a side surface of the first heating block 265 and a temperature of a side surface of the second heating block 268. The temperature measuring part 167 provides a measured temperature signal to the temperature control part 166. The temperature control part 166 may perform PID control to maintain a set temperature. The audio amplifiers 163 and 165 may drive the first heating coil 162 and the second heating coil 164, respectively. Currents flowing to the first heating coil 162 and the second heating coil 164 may be adjusted by the PID control.

The temperature control part 166 may include a function generator to output a sine wave, a high-pass filter having a cut-off frequency of about 1.5 kHz, an analog multiplier, and a PID controller. The function generator may output a sine wave of 5 to 30 kHz. The high-pass filter may receive an output signal of the function generator to eliminate a low-frequency component. The analog multiplier may multiply and output the sine wave of the function generator by a carrier input signal provided from the PID controller. An output signal of the analog multiplier may be amplified by the audio amplifiers 163 and 165 to be provided to the first heating coil 162 or the second heating coil 164.

The first heating block 265 may be in the form a square container stacked on a base part 265d having a square-plate shape. The first heating block 265 may include a lid 265c. Four upper side surfaces of the square container may be all removed except for their corner portions. The transparent window 265a may be disposed at the removed portion. The probe beam or the pump beam may pass through the transparent window 265a. A vapor cell 110 may be disposed inside the first heating block 265. The first heating block 265 may be a ceramic material. Height of a lower surface of the main cell 112 may be greater than that of a lower surface of the first heating block 265.

The first heating coil 162 may heat the hexahedronal main cell 112 to a temperature of 200 degrees centigrade. The first heating coil 162 may be a heating t wire along which alternating current (AC) of 5 to 30 kHz flows.

The second heating block 268 may heat a stem cell 114 extending from a lower surface of the main cell 112. The second heating block 268 may be in the form of a cylinder. The stem cell 114 may be disposed inside the cylindrical second heating block 268. The second heating block 268 may be a ceramic material.

The second heating coil 164 may be disposed to cover the second heating block 268. The second heating coil 164 may heat the stem cell 114 at a temperature of 180 degrees centigrade. The second heating coil 164 may be a heating wire along which alternating current (AC) of 5 to 30 kHz flows.

The thermally insulating block 267 includes a central thermally insulating block 264 including a through-hole 264a formed in its center, a recessed portion 264b aligned with the through-hole 264a, a protrusion 264c disposed outside the recessed portion 264b, and an alignment trench 264d formed on a top surface of the protrusion 264c, an upper thermally insulating block 266 inserted into an upper alignment trench 264d of the protrusion 264c and including a through-hole 266a formed on its side surface, and a lower thermally insulating block 263 inserted into a lower alignment trench 264e formed on a top surface of the protrusion 264c. The thermally insulating block 267 may be a polytetrafluoroethylene (PTFE) material.

The central thermally insulating block 264 may be in the form of a square container having a through-hole 264a formed on its bottom surface. The upper alignment trench 264*d* and the lower alignment trench 264*e* may be formed on a top surface and a bottom surface of the central thermally insulating block 264, respectively. The upper thermally insulating block 266 may be inserted into the upper alignment trench 264*d* to be aligned, and the lower thermally insulating block 264 may be inserted into the lower alignment trench 264*e* to be aligned.

The upper thermally insulating block 266 may be in the form of a square container having a closed top surface. Through-holes 266*a* may be formed at four side surfaces of the upper thermally insulating block 266. The pump beam or the probe beam may pass through the through-hole 266*a*. The lower thermally insulating block 263 may be in the form of a square container. The recessed portion 264*b* of the central thermally insulating block 264 may be inserted and combined with a bottom surface of the first heating block 265.

A top surface of a support block 261 may be inserted and combined with a bottom surface of the lower thermally insulating block 263. In addition, the top surface of the support block 261 may be inserted and combined with a bottom surface of an outer thermally insulating block 262. The outer thermally insulating block 262 may be disposed to cover the thermally insulating block 267. The support block 261 may be in the form of a chair with four legs.

The outer thermally insulating block 262 may have winding trenches 262*a* and 262*b* to define a fluid path at an outer side surface and a top surface of the outer thermally insulating block 262. A coolant may flow along the fluid path. The outer thermally insulating block 262 may be disposed to cover the thermally insulating block 267. The trenches 262*a* and 262*b* may provide a coolant path by an outer thermally insulating plate. Through-holes 262*c* facing each other may be formed at four side surfaces of the outer thermally insulating block 262. The pump beam or the probe beam may pass through the through-hole 262*c*.

An atomic magnetometer according to an embodiment of the present invention includes a hexahedronal main cell and a cylindrical stem cell connected to the main cell and includes a vapor cell receiving circularly polarized pump beam and linearly polarized probe beam and containing alkali metal vapor, a detector receiving the linearly polarized probe beam passing through the vapor cell to measure a polarization state of the probe beam, and a heating part applying alternating current (AC) of 5 to 30 kHz to a heating wire to heat the vapor cell. A measurement magnetic field of a measurement target provides magneto-optical rotation of the probe beam in the vapor cell.

In an embodiment of the present invention, the vapor cell may include a main cell containing potassium (K) as an alkali metal vapor, a helium buffer gas, and a nitrogen quenching gas and a stem cell preventing adsorption of the alkali metal vapor.

In an embodiment of the present invention, the atomic magnetometer may further include a first heating part applying alternating current (AC) of 5 to 30 kHz to a heating wire to heat the main cell of the vapor cell at a temperature of 200 degrees centigrade and a second heating part applying the AC of 5 to 30 kHz to the heating t wire to heat the stem cell at a temperature of 185 degrees centigrade.

In an embodiment of the present invention, the heating part may include a first heating block including a through-hole formed on its bottom surface and a transparent window formed on its side surface, a first heating coil disposed to cover an outer circumferential surface of the first heating block, a second heating block aligned with the through-hole of the first heating block and disposed to cover the periphery of the stem cell, a second heating coil disposed to cover the second heating block, and a thermally insulating block to store the first heating block and the second heating block. The main cell may be aligned with the transparent window of the first heating block.

In application as a small magnetic field measurement apparatus, measuring capability of a polarization rotation angle is very important.

Figure 11:
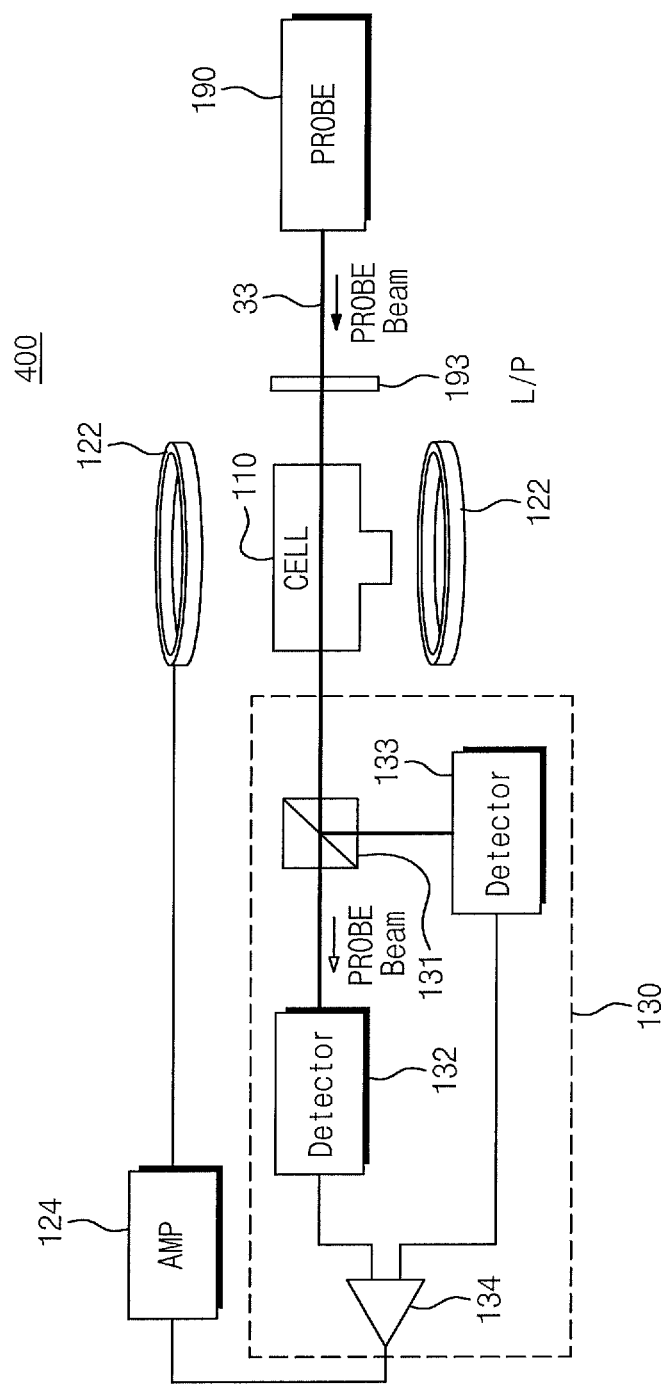
FIG. 11 illustrates a method for measuring a polarization rotation angle according to an embodiment of the present invention.

FIG. 11 illustrates a method for measuring a polarization rotation angle according to an embodiment of the present invention.

Referring to FIG. 11, a balanced polarimeter is used as a detector 130 to measure a polarization rotation angle of the atomic magnetometer 400. The atomic magnetometer 400 includes a vapor cell 110 receiving a circularly polarized pump beam and a linearly polarized probe beam and containing an alkali metal vapor, a detector 130 receiving the probe beam passing through the vapor cell to measure magneto-optical rotation of the probe beam, a feedback coil 122 generating a negative feedback magnetic field signal orthogonal to a first plane defined traveling directions of the probe beam and the pump beam and providing the negative feedback magnetic field signal to the vapor cell 110, and a feedback amplifier 124 receiving an output signal of the detector 130 and providing feedback current to a feedback coil to generate a negative feedback magnetic field proportional to a measurement magnetic field. The measurement magnetic field of a measurement target provides magneto-optical rotation of the probe beam in the vapor cell 110.

The detector 130 may include a polarization beam splitter 131, a first photodiode 132, a second photodiode 133, and a differential amplifier 134.

The polarization beam splitter 131 is disposed to be tilted to an initial polarization direction of the probe beam at an angle of 45 degrees. Beam passing through the polarization beam splitter 131 is split into two beams $I_1$ and $I_2$, as below.

$$I_1 = I_0 \sin^2\left(\theta - \frac{\pi}{4}\right)$$
$$I_2 = I_0 \cos^2\left(\theta - \frac{\pi}{4}\right)$$

Equation (4)

In the Equation (4), $I_1+I_2=I_0$ and $\theta$ represents the polarization rotation angle. In case of a small polarization rotation angle ($\theta \ll 1$), the polarization rotation angle may be given by a difference between intensities of two beams.

$$\theta \approx \frac{(I_1 - I_2)}{2(I_1 + I_2)}$$

Equation (5)

An output of the first photodiode 132 and an output of the second photodiode 133 are provided to a differential amplifier 133. Thus, an output of the differential amplifier 134 may be in proportion to the polarization rotation angle.

According to an embodiment of the present invention, for negative feedback, the output of the differential amplifier 134 is provided to the feedback amplifier 124 to be amplified. The feedback amplifier 124 may be an audio amplifier. Amplified output current of the audio amplifier is provided to the feedback coil 122. Current flowing to the feedback coil 122 establishes a negative feedback magnetic field. The negative feedback magnetic field is opposite in direction to the measurement magnetic field of the measurement target.

An operating method of an atomic magnetometer according to an embodiment of the present invention includes providing a circularly polarized pump beam and a linearly polarized probe beam to a vapor cell 110 containing an alkali metal vapor under a measurement magnetic field established by a measurement target 20, detecting a polarization rotation signal from the linearly polarization probe beam passing through the vapor cell 110 according to a polarization state of the probe beam by using a detector 130, and amplifying the polarization rotation signal to establish a negative feedback magnetic field of a direction opposite to that of the measurement magnetic field and providing the negative feedback magnetic field to the vapor cell 110.

Detecting the polarization rotation signal may include splitting the probe beam passing through the vapor cell 100 into a first polarization beam and a second polarization beam of different polarization directions; measuring the intensity of the first polarization beam and the intensity of the second polarization beam; and extracting a polarization rotation angle signal using a difference between a first measurement signal of the first polarization beam and a second measurement signal of the second polarization beam.

The operating method may further include establishing a compensation magnetic field to remove an external environmental magnetic field having an effect on the vapor cell 110 while the measurement target 20 is removed. The compensation magnetic field may include a y-axis compensation magnetic field orthogonal to a first plane to which the pump beam and the probe beam travels, an x-axis compensation magnetic field parallel to the first plane, and a z-axis compensation magnetic field orthogonal to the x-axis compensation magnetic field. The y-axis compensation magnetic field may be set to a y-axis DC value such that the polarization rotation angle is made zero under the external environment magnetic field. The x-axis compensation magnetic field may be set to an x-axis DC value such that the polarization rotation angle is made zero under the external environmental magnetic field. The z-axis compensation magnetic field may be set to a z-axis DC value such that the polarization rotation angle is made zero under the external environmental magnetic field.

Figure 12:
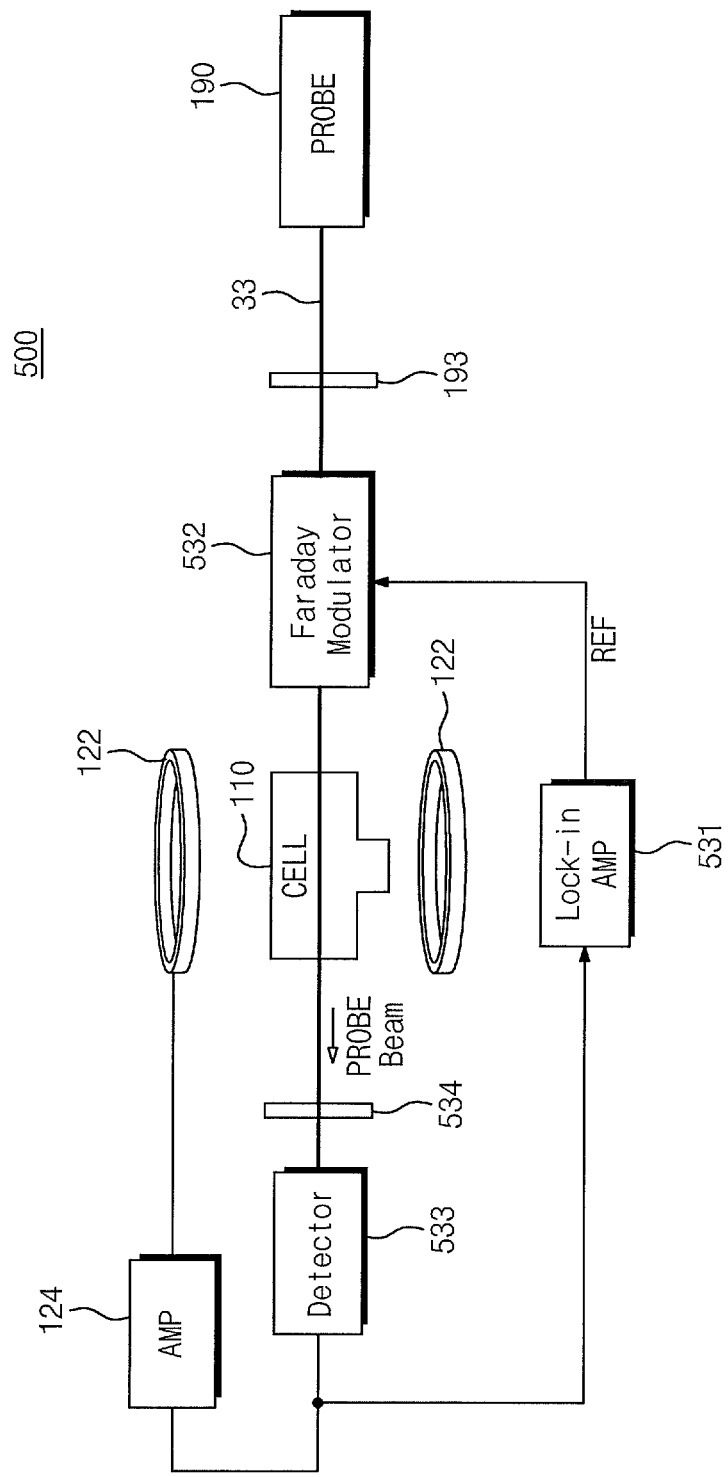
FIG. 12 illustrates a method for measuring a polarization rotation angle according to another embodiment of the present invention.

FIG. 12 illustrates a method for measuring a polarization rotation angle according to another embodiment of the present invention.

Referring to FIG. 12, an atomic magnetometer 500 includes a vapor cell 110 receiving a circularly polarized pump beam and a linearly polarized probe beam and containing an alkali metal vapor, a detector 533 receiving the probe beam passing through the vapor cell to measure magneto-optical rotation of the probe beam, a feedback coil 122 generating a negative feedback magnetic field signal orthogonal to a first plane defined traveling directions of the probe beam and the pump beam and providing the negative feedback magnetic field signal to the vapor cell 110, and a feedback amplifier 124 receiving an output signal of the detector 533 and providing feedback current to a feedback coil to generate a negative feedback magnetic field proportional to a measurement magnetic field. The measurement magnetic field of a measurement target provides magneto-optical rotation of the probe beam in the vapor cell 110.

The atomic magnetometer 500 may further includes a pump beam light source 180 providing the pump beam, a probe beam light source 190 providing the probe beam, a modulator 532 disposed between the probe beam light source 190 and the vapor cell 110 to modulate a polarization rotation angle of the probe beam to a predetermined modulation frequency, and a lock-in amplifier 531 providing a reference modulation frequency signal of the modulation frequency to the modulator 532 and receiving an output signal of the detector 533 to extract a modulation frequency component or its high-frequency harmonics components.

The modulator 532 is disposed in front of the vapor cell 110. The modulator 532 may be a Faraday modulator. The Faraday modulator 532 provides the probe beam to the vapor cell 110 after polarization-modulating the probe beam, and the polarization-modulated probe beam interacts with atoms.

A magnetic field oscillating at a modulation angular frequency $\omega_{mod}$ of several kHz may modulate a polarization direction of the probe beam at a very small angle by the Faraday rotation effect. Thereafter, the modulated light magneto-optically rotates by an angle while passing through the vapor cell 110. The rotating light passes through a linear polarizer 534 mounted at an angle of 90 degrees to an initial polarization direction of light. At this point, the light passing through the linear polarizer 534 is measured by the detector 533. The intensity of the light passing through the linear polarizer 534 is given as below.

$$I = I_0 \sin^2(\theta + \alpha\sin(\omega_{mod}t)) \approx \quad \text{Equation (6)}$$
$$I_0[\theta + 2\theta\alpha\sin(\omega_{mod}t) + \alpha^2\sin^2(\omega_{mod}t)]$$

In the Equation (6), $I_0$ represents the intensity of the light passing through the vapor cell 110. A Fourier component of light detected at the modulation angular frequency $\omega_{mod}$ is in proportion to a light rotation angle θ. In the Equation (6), α represents modulation amplitude. In an output signal of the detector 533, a component of the angular frequency $\omega_{mod}$ is detected through the lock-in amplifier 531.

$$I_{\omega_{mod}} \approx 2I_0 \theta \alpha$$

The lock-in amplifier 531 may output and provide a reference frequency REF of the modulation angular frequency $\omega_{mod}$ as a modulation signal of the Faraday modulator 532.

The detector 533 may be a photodiode. An output of the detector 533 may be provided as an input of the lock-in amplifier 531.

According to an embodiment of the present invention, for negative feedback, the output of the detector 533 is provided to the feedback amplifier 124 to be amplified. Amplified output current of the feedback amplifier 124 is provided to the feedback coil 122. Current flowing to the feedback coil 122 establishes a negative feedback magnetic field. The negative feedback magnetic field is opposite in direction to the measurement magnetic field of the measurement target.

An operating method of an atomic magnetometer according to an embodiment of the present invention includes providing a circularly polarized pump beam and a linearly polarized probe beam to a vapor cell 110 containing an alkali metal vapor under a measurement magnetic field established by a measurement target 20, detecting a polarization rotation signal from the linearly polarization probe beam passing through the vapor cell 110 according to a polarization state of the probe beam by using a detector 533; and amplifying the polarization rotation signal to establish a negative feedback magnetic field of a direction opposite to that of the measurement magnetic field and provide the negative feedback magnetic field to the vapor cell 110.

Detecting the polarization rotation signal may include modulating a polarization rotation angle of the probe beam to a predetermined modulation frequency at the front end of the vapor cell 110, measuring the intensity of 90-rotated probe beam in an initial polarization state by making the probe beam pass through the vapor cell 110 and a linear polarizer 534, and extracting a polarization rotation angle of the probe beam as a modulation frequency component or its high-frequency harmonics components from the measured intensity of the probe beam.

Figure 13:
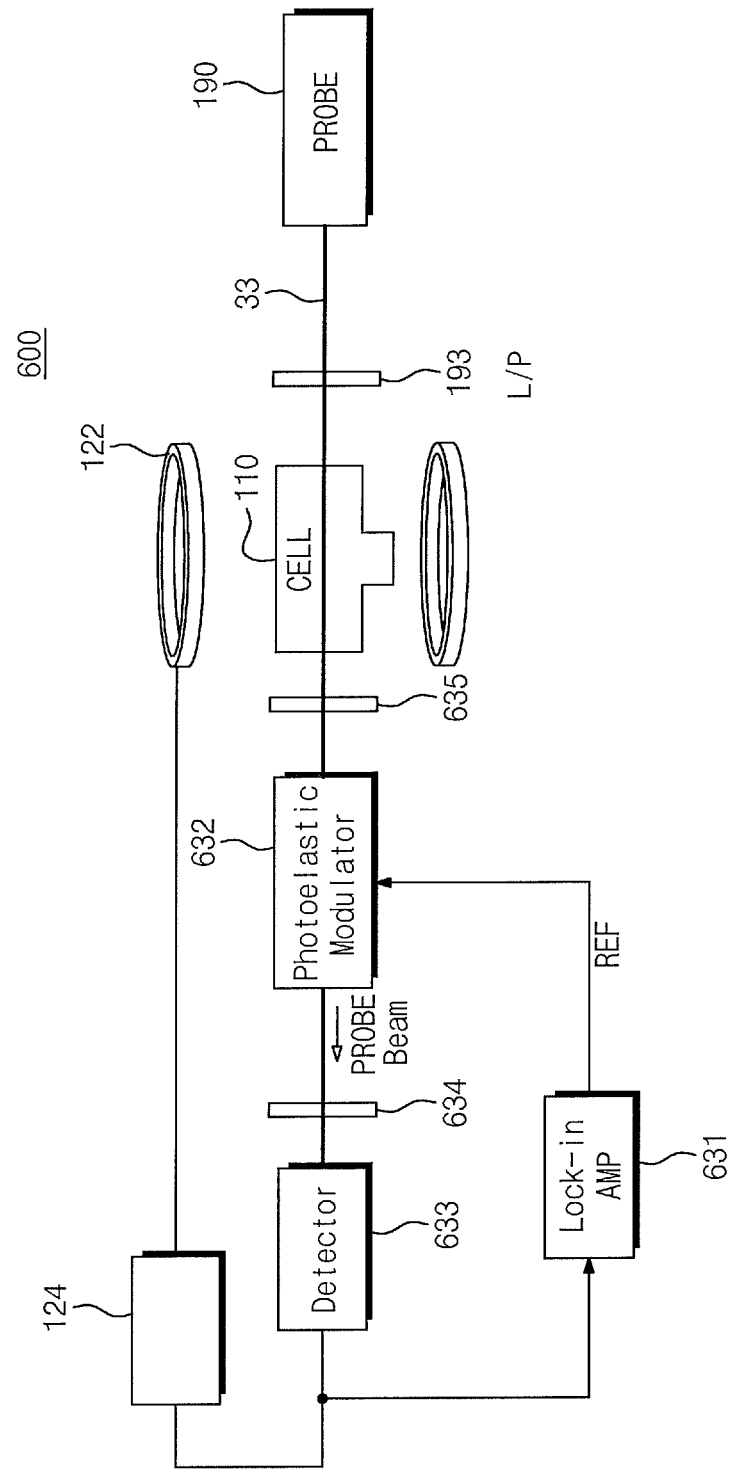
FIG. 13 illustrates a method for measuring a polarization rotation angle according to further another embodiment of the present invention.

FIG. 13 illustrates a method for measuring a polarization rotation angle according to further another embodiment of the present invention.

Referring to FIG. 13, an atomic magnetometer 600 includes a vapor cell 110 receiving a circularly polarized pump beam and a linearly polarized probe beam and containing an alkali metal vapor, a detector 633 receiving the probe beam passing through the vapor cell to measure magneto-optical rotation of the probe beam, a feedback coil 122 generating a negative feedback magnetic field signal orthogonal to a first plane defined traveling directions of the probe beam and the pump beam and providing the negative feedback magnetic field signal to the vapor cell 110, and a feedback amplifier 124 receiving an output signal of the detector 633 and providing feedback current to a feedback coil to generate a negative feedback magnetic field proportional to a measurement magnetic field. The measurement magnetic field of a measurement target provides magneto-optical rotation of the probe beam in the vapor cell 110.

The atomic magnetometer 600 may further includes a pump beam light source 180 providing the pump beam, a probe beam light source 190 providing the probe beam, a modulator 632 disposed between the detector 633 and the vapor cell 110 to modulate a polarization rotation angle of the probe beam to a predetermined modulation frequency, and a lock-in amplifier 631 providing a reference modulation frequency signal REF of the modulation frequency to the modulator 632 and receiving an output signal of the detector 633 to extract a modulation frequency component or its high-frequency harmonics components.

A photoelastic modulator is used as the modulator 632 to measure the polarization rotation angle of the atomic magnetometer 600. A linearly polarized probe beam passes through the photoelastic modulator via a quarter wave plate 635 after passing through the vapor cell 110. The probe beam is oscillated at an angular frequency $\omega_{mod}$ by birefringence of the photoelastic modulator. In this case, the modulation angular frequency $\omega_{mod}$ is generally 10 to 100 kHz. An optic axis of the quarter wave plate 635 is disposed parallel to initial polarization of the probe beam, and an optic axis of the photoelastic modulator is fixed to 45 degrees.

If the light passing through the vapor cell 110 does not rotate, polarization of the probe beam is symmetrically modulated with predetermined amplitude. However, if there is an optical rotation, polarization of light is asymmetrically modulated by an absorption difference between right circular polarization and left circular polarization.

When the light passes through the linear polarizer 634 fixed to 90 degrees to initial polarization direction of the probe beam, the intensity of the light is given as below.

$$I = I_0 \sin^2(\theta + \alpha \sin(\omega_{mod})) \quad \text{Equation (8)}$$

In the Equation (8), $I_0$ represents the intensity of the light passing through the vapor cell 110, $\omega_{mod}$ represents a modulation angular frequency, and $\alpha$ represents modulation amplitude. The intensity of the light is in proportion to the modulation frequency component (first harmonic signal) and is given as below.

$$I_{\omega_{mod}} \approx 2 I_0 \theta \alpha \quad \text{Equation (9)}$$

The lock-in amplifier 631 may extract the modulation frequency component (first harmonic signal) of the light intensity. The lock-in amplifier 631 may output and provide the reference modulation signal REF of the modulation angular frequency $\omega_{mod}$ to the modulator 632.

An operating method of an atomic magnetometer according to an embodiment of the present invention includes providing a circularly polarized pump beam and a linearly polarized probe beam to a vapor cell 110 containing an alkali metal vapor under a measurement magnetic field established by a measurement target, detecting a polarization rotation signal from the linearly polarization probe beam passing through the vapor cell 110 according to a polarization state of the probe beam by using a detector 633, and amplifying the polarization rotation signal to establish a negative feedback magnetic field of a direction opposite to that of the measurement magnetic field and provide the negative feedback magnetic field to the vapor cell 110.

Detecting the polarization rotation signal may include modulating a polarization rotation angle of the probe beam to a predetermined modulation frequency by making the probe beam pass through a quarter wave plate 635 and a modulator 632 at the back end of the vapor cell 110, measuring the intensity of the probe beam by making the probe beam pass through the linear polarizer 634, and extracting a polarization rotation angle of the probe beam as a modulation frequency component or its high-frequency harmonics component from the measured intensity of the probe beam.

Figure 14:
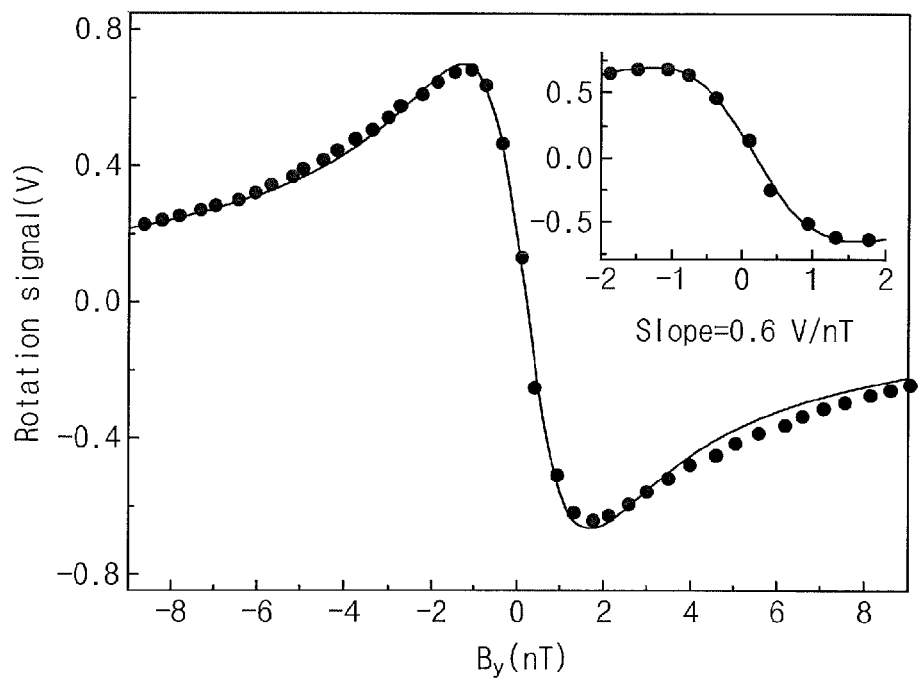
FIG. 14 illustrates a magneto-optical rotation signal according to a function of a test magnetic field $B_y$ in the SERF regime.

FIG. 14 illustrates a magneto-optical rotation signal according to a function of a test magnetic field in the SERF regime.

Referring to FIG. 14, the magneto-optic ration signal may be in proportion to an optical rotation angle when a balanced polarimeter is used. A solid line denotes a theoretical result given by a steady state solution of Block equation, and Circular shapes denote a measurement result.

Figure 15:
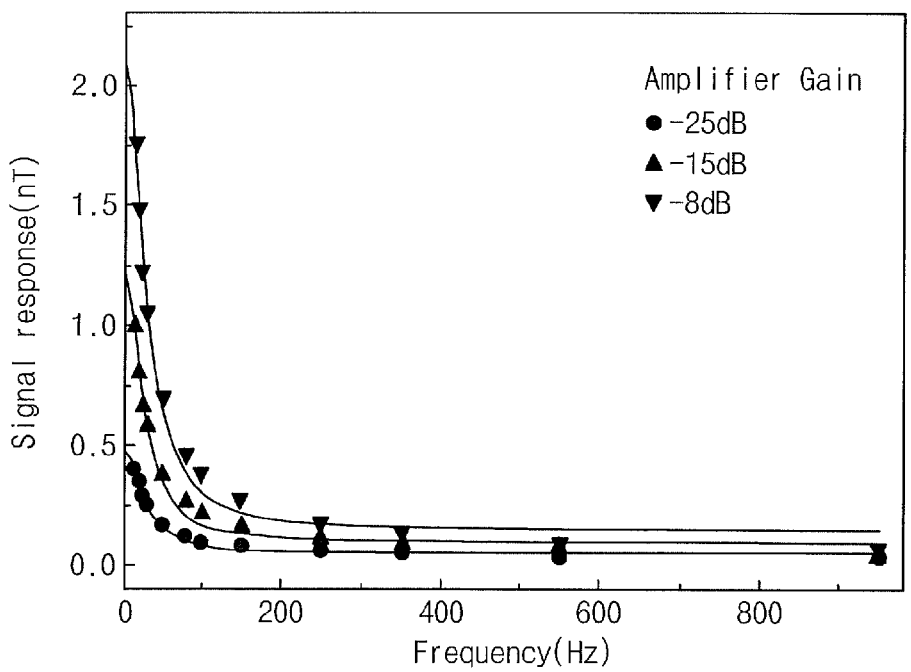
FIG. 15 illustrates a frequency response of the atomic magnetometer in FIG. 5.

FIG. 15 illustrates a frequency response of the atomic magnetometer in FIG. 5.

Referring to FIG. 15, it may be assumed that the atomic magnetometer 200 is a virtual amplifier. According to a gain G of the virtual amplifier, a frequency response is shown when a balanced polarimeter is used.

A disperse-type resonance curve denotes polarization rotation of probe beam to a transverse magnetic field $B_y$. Sensitivity of the atomic magnetometer 200 is in proportion to a slope of a dispersion signal in the vicinity of a zero magnetic field. In order to maintain maximum sensitivity, a variable parameter of the test device was adjusted to maximize a dispersion curve slope during a test to observe peak-to-peak amplitude and spectral width of the polarization rotation signal.

Under the test conditions, laser intensities of pump beam and probe beam were measured as 33 mW/cm$^2$ and 5 mW/cm$^2$, respectively.

In a DC $B_y$ magnetic field, a slope of a single decides $G_0$. A measurement is that $G_0$ is 0.6 V/nT. A sine wave electric signal of 350 mVpp is provided to an input of the feedback amplifier 124 connected to the feedback coil 122 to calculate a feedback gain parameter $\beta$. In this case, a feedback magnetic field established by the feedback coil 122 was detected by the atomic magnetometer within the range between 15 Hz and 1 kHz. A measured output voltage of a detector was converted into a magnetic field using the $G_0$. Power bandwidth of the feedback amplifier 124 has a restricted range between 10 Hz and 40 kHz. Accordingly, data fitted to the Lorentzian function was centered at 0 Hz to obtain an output voltage at 0 Hz. Thus, gains of the virtual amplifier of −25, 15, and −8 dB were converted into 0.5, 0.2, and 3.5 nT/V, respectively.

Figure 16:
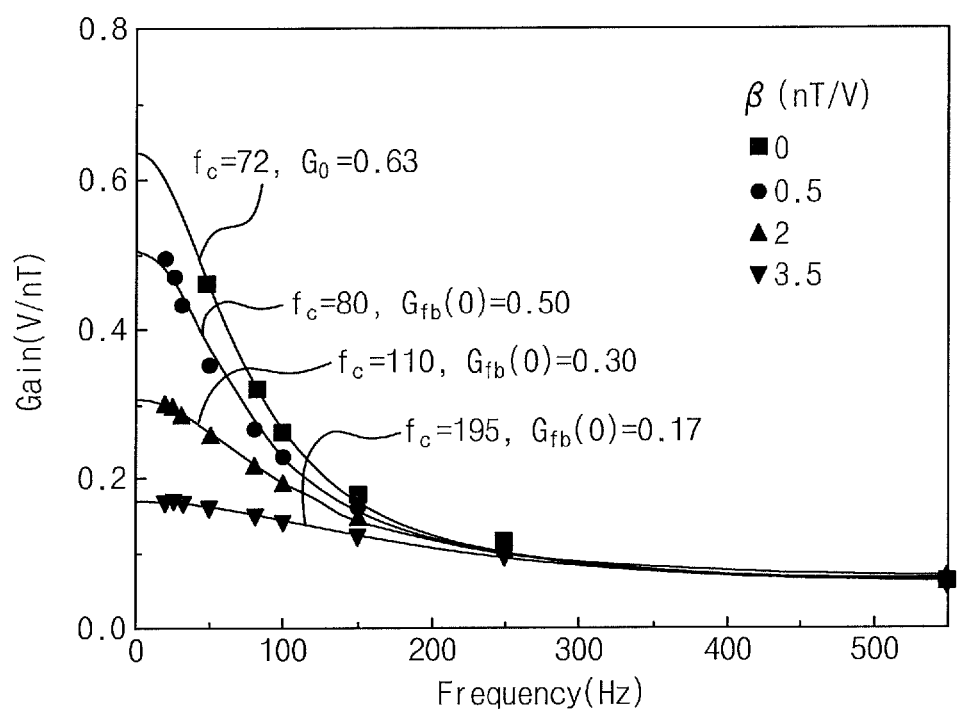
FIG. 16 illustrates a frequency response to an input oscillatory magnetic field having amplitude of 600 pT to multiple frequencies.

FIG. 16 illustrates a frequency response to an input oscillatory magnetic field having amplitude of 600 pT to multiple frequencies.

Referring to FIG. 16, incident beam intensities of pump beam and probe beam are 33 mV/cm$^2$ and 5 mW/cm$^2$, respectively. Measured data is fitted to a Lorentzian shape. In this figure, $f_C$ represents half width at half maximum of the fitted Lorentzian shape. The half width at half maximum may be treated as a cut-off frequency of a single pole amplifier. In case of an open loop, $f_C$ is 72 Hz. In case of a closed loop with negative feedback, $f_C$ may increase to 195 Hz.

A frequency-dependent open loop signal was measured with respect to feedback gain parameters β 0.5, 0.2, and 3.5 nT/V to investigate a frequency response of the atomic magnetometer 200 under negative feedback. The measured data is fitted to a Lorentzian shape. Thus, $f_C$ and $G_{fb}(0)$ are estimated.

When negative feedback is not used, data on a frequency of 50 Hz or less may not be measured by photodiode output saturation.

When β=3.5 nT/V, a curve of a frequency response is almost flat to 195 Hz that is half width at half maximum. According to the Equation (3), $f_C$ must be multiplied by a $(1+βG_0)$ factor and $G_{fb}$ must be divided by the $(1+βG_0)$ factor. The calculated cut-off frequencies $f_C$ for 0.5, 0.2, and 3.5 nT/V are given as 93.6, 158, and 223 Hz, respectively.

An experimentally obtained cut-off frequency $f_C$ for 0.5, 0.2, and 3.5 nT/V are given as 80, 110, and 195 Hz, respectively. However, the experimental values 80, 110, and 195 are almost similar to the calculated values 93.6, 158, and 223.

Performance of the feedback system may be evaluated by a correlation between a measured signal and a test magnetic field. The test magnetic field may be established by a test coil to emulate a rat's MCG signal.

Figure 17A:
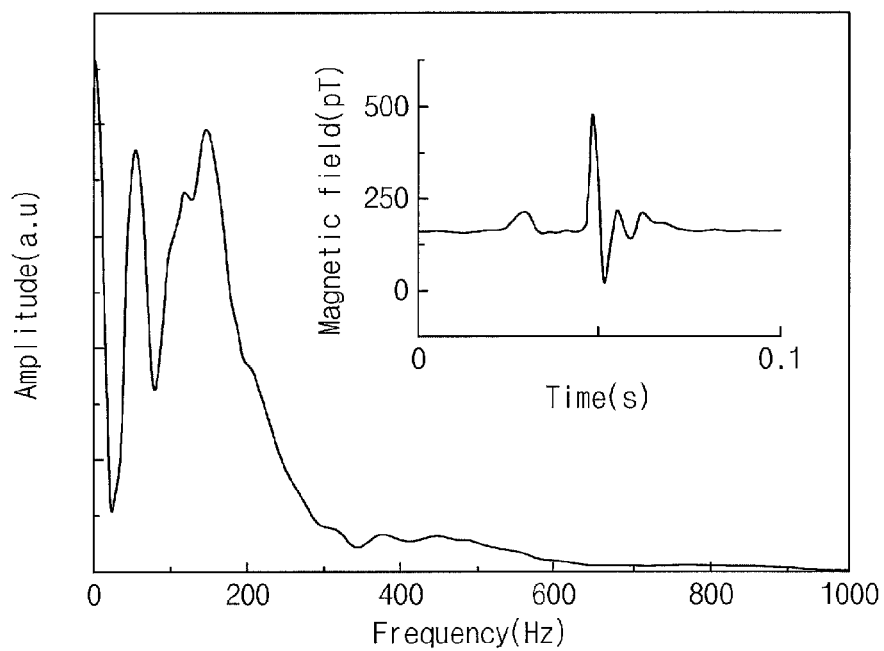
FIG. 17A shows a test magnetic field in a frequency domain.
Figure 17B:
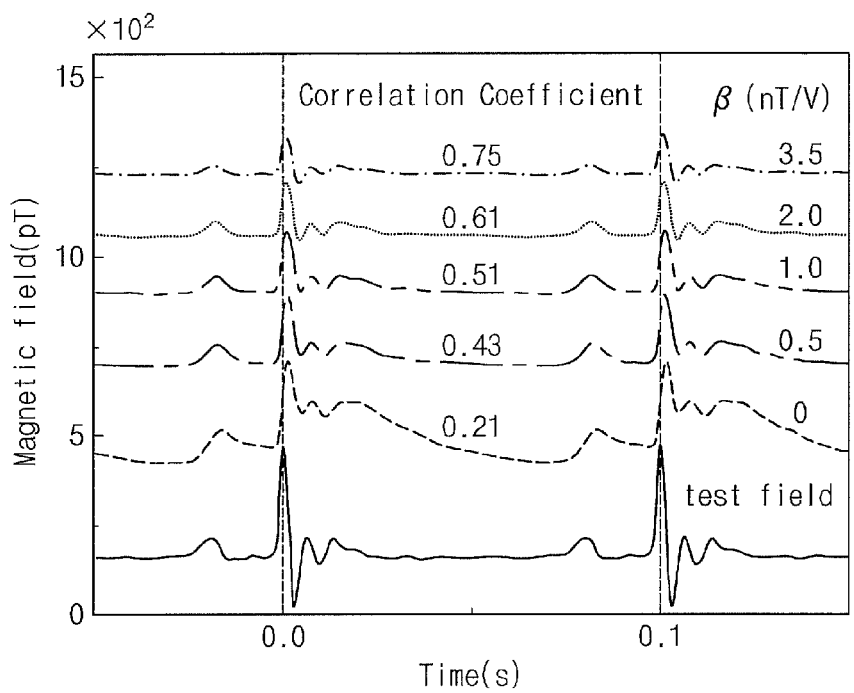
FIG. 17B shows a measuring signal in a time domain to measure a test magnetic field signal in FIG. 17A.
Figure 17C:
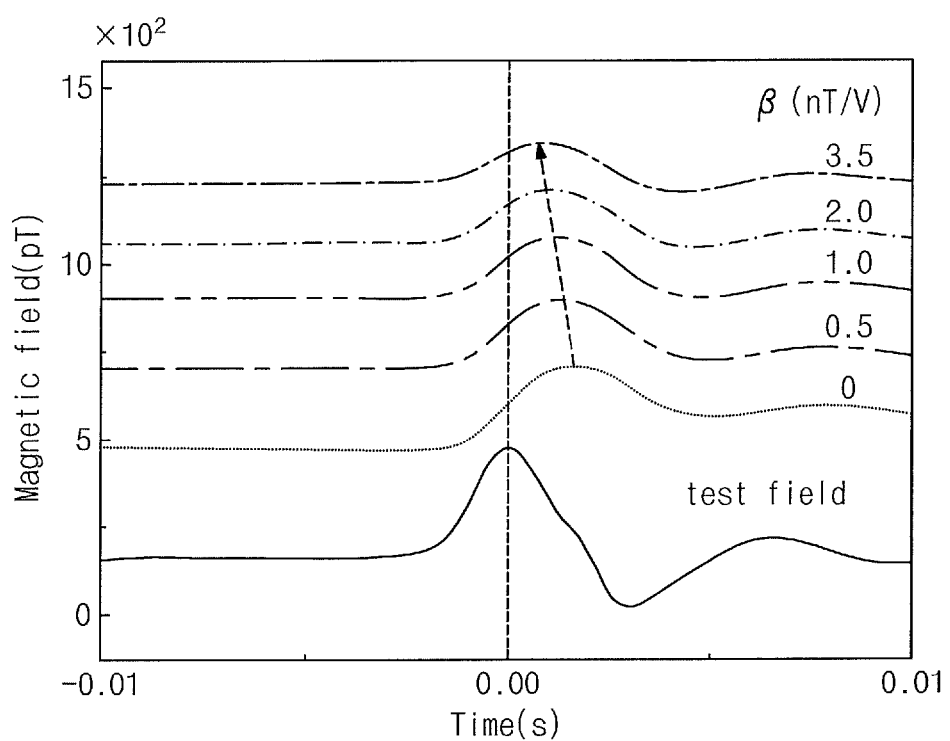
FIG. 17C is a graph showing an enlarged version of the measuring signal in FIG. 17B.

FIG. 17A shows a test magnetic field in a frequency domain, FIG. 17B shows a measuring signal in a time domain to measure a test magnetic field signal in FIG. 17A, and FIG. 17C is a graph showing an enlarged version of the measuring signal in FIG. 17B.

Referring to FIG. 17, a test magnetic field is an MCG-like signal. The test magnetic field has peak-to-peak amplitude of 500 pT and a cycle of 0.1 second between R peaks. The test magnetic field includes a multiple frequency component. When β=0, an open loop is formed, a low-frequency response causes distortion, and a frequency higher than half width at half maximum causes signal delay. As β increases to 3.5 nT/V, the signal distortion is reduced and the signal delay is reduced.

A Fourier transformation (FT) spectrum of the MCG-like signal includes a multiple frequency components between 0 Hz and 200 Hz.

A test coil establishing the test magnetic field is disposed to be spaced apart from a vapor cell by 25 mm and has a diameter of 5 mm. The test coil is a circular coil and establishes a magnetic field of a y-axis direction.

The test coil establishes a test coil in a time area with respect to 0, 0.5, 1.0, 2.0, and 3.5 nT/V.

A higher feedback gain β resulted in a higher correlation coefficient corresponding to less distortion.

When β=3.5 nT/V, the bandwidth of 195 Hz covers approximately 70 percent of the total spectrum.

When β=3.5 nT/V, bandwidth of 195 Hz covers about 70 percent of the overall spectrum. The obtained correlation of 0.75 can plausibly be explained by the consequence of the extended bandwidth.

The amplitude of the measured signal was calibrated to the scale of the magnetic field. As β increased, not only were the distortions from the low frequency components suppressed but also the phase differences were reduced because of the signal lagging beyond the half width at half maximum point.

We calculated the linear correlation between the measured signals and the test field to evaluate the degree of distortions in the measured signals. When β=3.5 nT/V, the correlation coefficient was 0.76 which approaches the ideal case of an output without distortions.

The noise level of an atomic magnetometer is an important factor determining an upper of the extension factor $(1+βG0)$. As the noise level of the atomic magnetometer system increases, the measured signal will be buried in the noise. Calibration peaks of a small oscillating field are used to measure the noise level of the atomic magnetometer. The total noise may be considered with an environmental magnetic noise, light shift noise, spin-projection noise, and photon shot-noise. The environmental magnetic noise and light shift noise may be reduced by the negative feedback.

Figure 18:
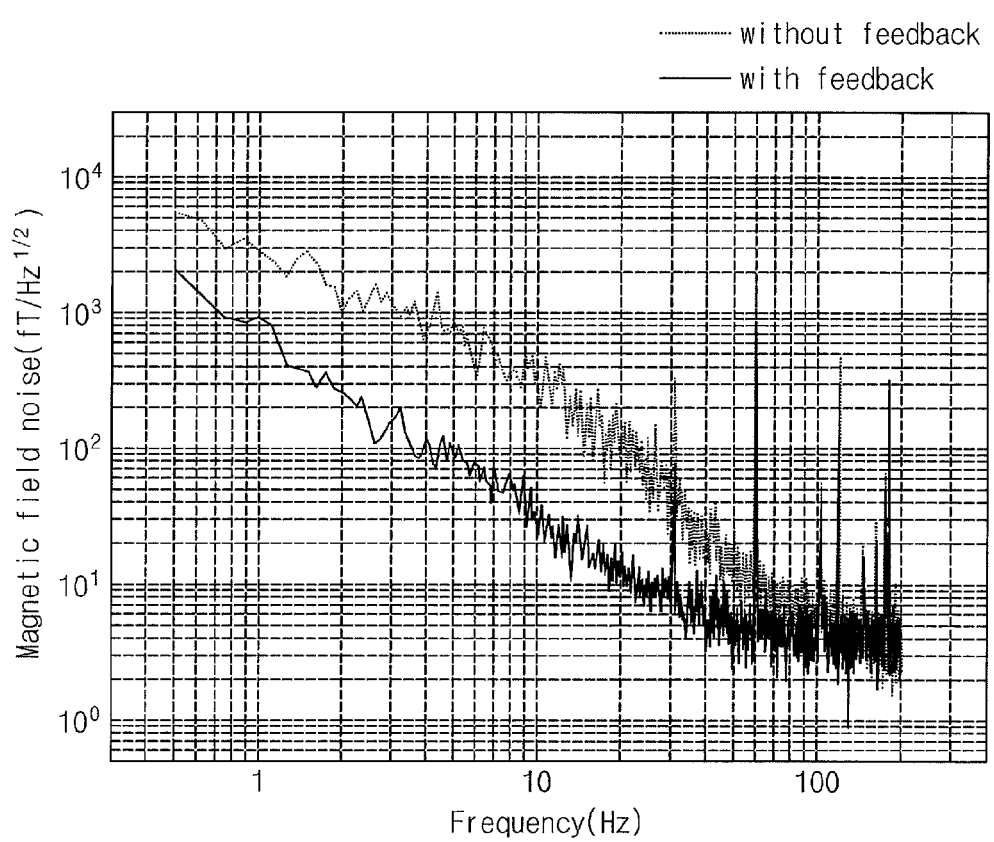
FIG. 18 illustrates a noise spectrum of an atomic magnetometer according to an embodiment of the present invention.

FIG. 18 illustrates a noise spectrum of an atomic magnetometer according to an embodiment of the present invention.

Referring to FIG. 18, the noise spectral densities of the system with and without the negative feedback are shown. The noise level in a low frequency range under a negative feedback gain β of 3.5 nT/V was suppressed compared to the noise level without the negative feedback. In the range of zero to 190 Hz, the noise level may be suppressed by approximately ten times. Therefore, the negative feedback scheme may widen the detection bandwidth without sacrificing SNR at the low frequency range.

Figure 19:
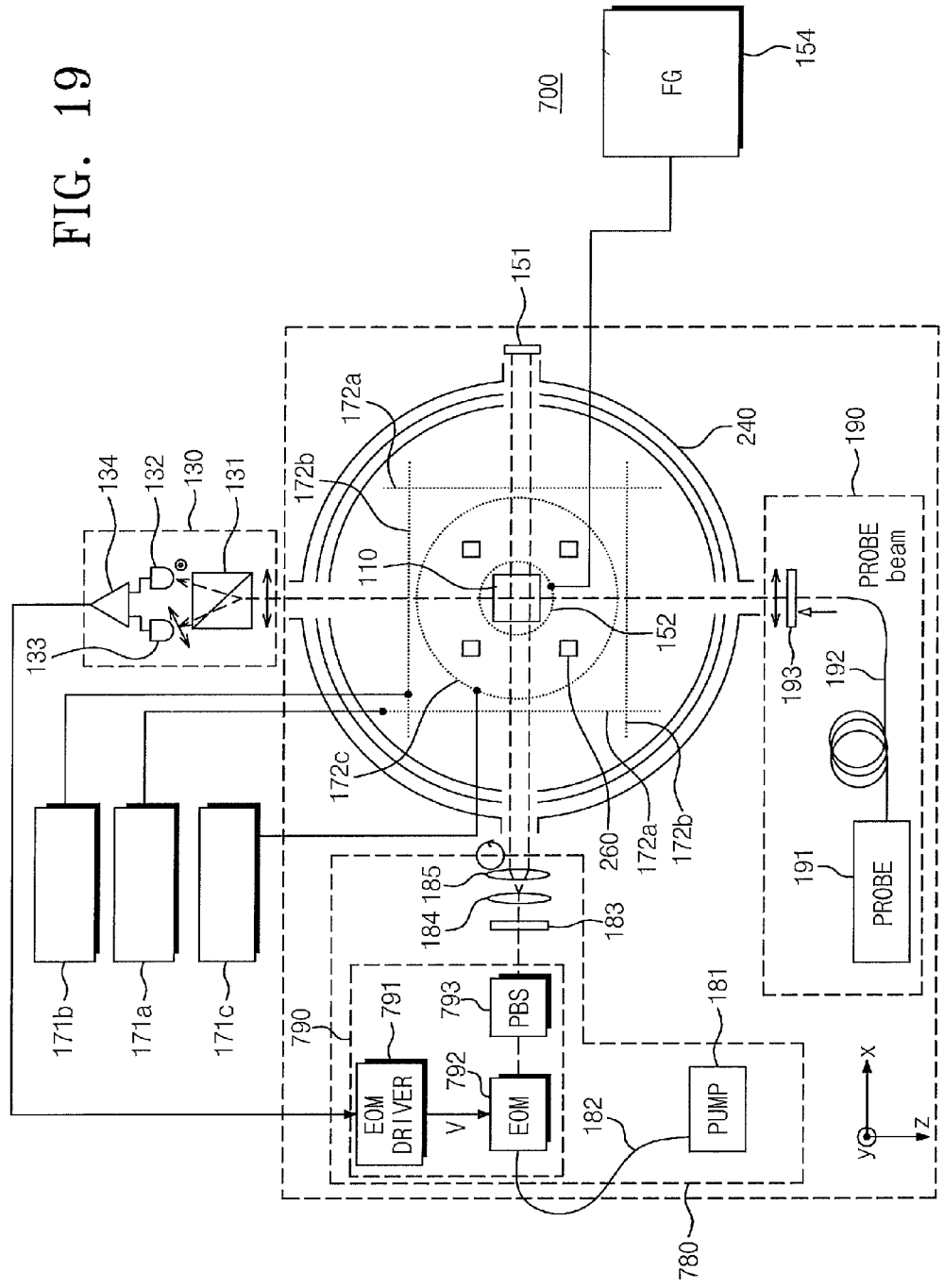
FIG. 19 is a conceptual diagram of an atomic magnetometer according to another embodiment of the present invention.

FIG. 19 is a conceptual diagram of an atomic magnetometer according to another embodiment of the present invention.

In FIG. 19, sections different from FIG. 5 will be extensively described to avoid duplicate description.

Referring to FIG. 19, as negative feedback reduces a signal-to-noise ratio and provides broad bandwidth, a magnetic field signal having a small size and varying fast may be measured. The negative feedback is provided to a vapor cell containing a metal vapor to increase sensitivity of a magnetic field and ensure a frequency area for precise measurement of MCG/MEG. In addition, the negative feedback may be performed by adjusting an output of a pump beam light source.

Specifically, light intensity negative feedback of pump beam may be used to extend a frequency response range of an atomic magnetometer 700. The light intensity negative feedback may feed a magneto-optical rotation signal of probe beam back to pumping beam.

A pump beam light source 780 may include a pump beam light intensity modulation part 790. The pump beam light intensity modulation part 790 may be disposed at an output terminal of the pump laser 181. The pump beam light intensity modulation part 790 may include an electro-optical modulator driver (EOM Driver) 792, an electro-optical modulator (EOM) 792, and a polarization beam splitter (PBS) 793. The electro-optical modulator driver 791 may receive an electric signal Vout from an output terminal of a detector 130 to output a driving voltage V that is in proportion to the electric signal Vout.

The electro-optical modulator 792 may rotate polarization direction or phase delay in proportion to the driving voltage V of the electro-optical modulator driver 791. A rotation angle of the polarization direction may be a function of the driving voltage V. For example, the electro-optical modulator 792 may be a Pockels cell, a Faraday Rotator or liquid crystal display (LCD) device. Therefore, the polarization direction of a linearly polarized beam impinging on the electro-optical modulator 792 may rotate in proportion to the driving voltage V.

The polarization beam splitter 793 may split incident beam according to a polarization state. Therefore, only predetermined linearly polarized beam is provided to a quarter wave plate 183 of the vapor cell.

The driving voltage V may be in proportion to the electric signal Vout at the output terminal of the detector 130. Alternatively, the driving voltage V may be in proportion to magneto-optical rotation of the probe beam. The magneto-optical rotation may be in proportion to the magnitude of a measurement magnetic field. That is, when the magnitude of the measurement magnetic field is small, the pump beam light intensity modulation part 790 may maintain the intensity of the pump beam at a set value. Meanwhile, when the magnitude of the measurement magnetic field is great, the pump beam light intensity modulation part 790 may provide pump beam having a value smaller than a set value.

According to an embodiment of the present invention, instead of a feedback coil 122, the pump beam light source modulation part 790 may extend a frequency response range of the atomic magnetometer.

As described above, according to an embodiment of the present invention, detection bandwidth of an atomic magnetometer may be extended by using negative feedback in the SERF regime.

According to an embodiment of the present invention, a flat-frequency response between zero and 190 Hz is achieved when negative feedback is used. Sensitivity of the flat-frequency response is maintained between 100 Hz and 3 $fT/Hz^{1/2}$ and increases by three times as compared to a case where negative feedback is not used.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. An atomic magnetometer comprising:
    a vapor cell for receiving a circularly polarized pump beam and a linearly polarized probe beam, wherein the vapor cell contains an alkali metal vapor;
    a detector configured to receive the probe beam passing through the vapor cell to measure magneto-optical rotation of the probe beam;
    a feedback coil configured to establish a negative feedback magnetic field signal orthogonal to a first plane defined by traveling directions of the probe beam and the pump beam and provide the negative feedback magnetic field signal to the vapor cell; and
    a feedback amplifier adapted to provide feedback current to the feedback coil such that the negative feedback magnetic field proportional to a measurement magnetic field is established,
    wherein the measurement magnetic field of a measurement target provides magneto-optical rotation of the probe beam in the vapor cell,
    wherein the vapor cell includes a main cell with a hexahedronal shape, a cylindrical stem cell connected to the main cell, and a heating part configured to heat the vapor cell, the heating part comprising:
        a first heating part to apply alternating current of 5 kHz to 30 kHz to a heating wire to heat the main cell of the vapor cell at a temperature of 200 degrees centigrade; and
        a second heating part to apply alternating current of 5 kHz to 30 kHz to a heating wire to heat the stem cell of the vapor cell at a temperature of 185 degrees centigrade, and
    wherein a difference between a temperature of the main cell and a temperature of the stem cell is constantly maintained.

2. The atomic magnetometer as set forth in claim 1, wherein the feedback coil and the feedback amplifier extend detection bandwidth of the atomic magnetometer.

3. The atomic magnetometer as set forth in claim 2, wherein a frequency response of the atomic magnetometer is flat from zero hertz (Hz) to hundreds of hertz (Hz).

4. The atomic magnetometer as set forth in claim 1, further comprising:
    a magnetic shielding part disposed around the vapor cell and made of a magnetic material to remove an external environmental magnetic field.

5. The atomic magnetometer as set forth in claim 1, further comprising:
    a magnetic field compensation part disposed around the vapor cell and generating a compensation magnetic field to remove an external environmental magnetic field.

6. The atomic magnetometer as set forth in claim 5, wherein the magnetic field compensation part comprises:
    an x-axis compensation coil to establish an x-axis compensation magnetic field;
    an x-axis compensation power source to provide current to the x-axis compensation coil;
    a z-axis compensation coil to establish a z-axis compensation magnetic field orthogonal to the x-axis compensation magnetic field;
    a z-axis compensation power source to provide current to the z-axis compensation coil;
    a y-axis compensation coil to establish a y-axis compensation magnetic field orthogonal to a first plane; and
    a y-axis compensation power source to provide DC current to the y-axis compensation coil.

7. The atomic magnetometer as set forth in claim 6, wherein the magnetic field compensation part further comprises at least one of:
    an x-axis lock-in amplifier receiving an output signal of the detector as an input to extract and output the first reference frequency component; and
    a z-axis lock-in amplifier receiving the output signal of the detector as an input to extract and output a second reference frequency component,
    wherein the x-axis lock-in amplifier provides a first reference frequency signal to the x-axis compensation power source,
    wherein the z-axis lock-in amplifier provides a second reference frequency signal to the z-axis compensation power source,
    wherein the x-axis compensation power source receives and modulates the first reference frequency signal of the x-axis lock-in amplifier and the second reference frequency component of the z-axis lock-in amplifier to output the first reference frequency signal, and wherein the z-axis compensation power source receives and modulates the second reference frequency signal of the z-axis lock-in amplifier and the first reference frequency component of the x-axis lock-in amplifier to output the second reference frequency signal.

8. The atomic magnetometer as set forth in claim 1, wherein the vapor cell comprises:
   the main cell containing potassium (K) as an alkali metal vapor, a helium buffer gas, and a nitrogen quenching gas; and
   the stem cell to prevent adsorption of the alkali metal vapor.

9. The atomic magnetometer as set forth in claim 8, wherein the main cell is a borosilicate glass material and the stem cell is aluminosilicate glass.

10. The atomic magnetometer as set forth in claim 1, wherein the heating part comprises:
   a first heating block, which includes a through-hole formed on a bottom surface thereof and a transparent window formed on a side surface thereof, and which is disposed to cover a periphery of the main cell;
   a first heating coil disposed to cover an outer circumferential surface of the first heating block;
   a second heating block, which is aligned with the through-hole of the first heating block and is disposed to cover a periphery of the stem cell;
   a second heating coil disposed to cover the second heating block; and
   a thermally insulating block to store the first heating block,
   wherein the main cell is aligned with the transparent window of the first heating block.

11. The atomic magnetometer as set forth in claim 10, wherein the thermally insulating block comprises:
   a central thermally insulating block, which includes a through-hole formed in a center of the central thermally insulating block, a recessed portion aligned with the through-hole, a protrusion disposed outside the recessed portion, and an alignment trench formed on a top surface of the protrusion;
   an upper thermally insulating block, which is inserted into an upper alignment trench of the protrusion and which includes a through-hole formed on a side surface thereof; and
   a lower thermally insulating block, which is inserted into a lower alignment trench formed on a bottom surface of the protrusion.

12. The atomic magnetometer as set forth in claim 11, further comprising:
   a support block, which is inserted and combined with a bottom surface of the second heating block and is inserted and combined with the lower thermally insulating block; and
   an outer thermally insulating block disposed on the support block and disposed to cover the thermally insulating block.

13. The atomic magnetometer as set forth in claim 1, further comprising:
   a pump beam light source for providing the pump beam;
   a probe beam light source for providing the probe beam;
   a modulator disposed between the probe beam light source and the vapor cell to modulate a polarization rotation angle of the probe beam to a predetermined modulation frequency; and
   a lock-in amplifier for providing a reference modulation frequency signal of the modulation frequency to the modulator and receiving an output signal of the detector to extract a modulation frequency component or high-frequency harmonics components.

14. An operating method of an atomic magnetometer, the method comprising:
   providing a circularly polarized pump beam and a linearly polarized probe beam to a vapor cell containing an alkali metal vapor under a measurement magnetic field established by a measurement target;
   detecting a polarization rotation signal from the linearly polarization probe beam passing through the vapor cell according to a polarization state of the probe beam by using a detector;
   amplifying the polarization rotation signal to establish, via a feedback coil, a negative feedback magnetic field of a direction opposite to that of the measurement magnetic field and provide the negative feedback magnetic field to the vapor cell; and
   providing, via a feedback amplifier, a feedback current to a feedback coil such that the negative feedback magnetic field proportional to the measurement magnetic field is established,
   wherein the measurement magnetic field of a measurement target provides magneto-optical rotation of the probe beam in the vapor cell,
   wherein the vapor cell includes a main cell with a hexahedronal shape, a cylindrical stem cell connected to the main cell, and a heating part configured to heat the vapor cell, the heating part comprising:
      a first heating part to apply alternating current of 5 kHz to 30 kHz to a heating wire to heat the main cell of the vapor cell at a temperature of 200 degrees centigrade; and
      a second heating part to apply alternating current of 5 kHz to 30 kHz to a heating wire to heat the stem cell of the vapor cell at a temperature of 185 degrees centigrade, and
   wherein a difference between a temperature of the main cell and a temperature of the stem cell is constantly maintained.

15. The operating method as set forth in claim 14, wherein detecting the polarization rotation signal comprises:
   splitting the probe beam passing through the vapor cell into a first polarization beam and a second polarization beam of different polarization directions;
   measuring the intensity of the first polarization beam and the intensity of the second polarization beam; and
   extracting a polarization rotation angle signal using a difference between a first measurement signal of the first polarization beam and a second measurement signal of the second polarization beam.

16. The operating method as set forth in claim 14, wherein detecting the polarization rotation signal comprises:
   modulating a polarization rotation angle of the probe beam to a predetermined modulation frequency at the front end of the vapor cell;
   measuring the intensity of 90-rotated probe beam in an initial polarization state by making the probe beam pass through the vapor cell and a linear polarizer; and
   extracting a polarization rotation angle of the probe beam as a modulation frequency component or its high-frequency harmonics components from the measured intensity of the probe beam.

17. The operating method as set forth in claim 14, wherein detecting the polarization rotation signal comprises:
   modulating a polarization rotation angle of the probe beam to a predetermined modulation frequency by making the probe beam pass through a quarter wave plate and a modulator at the back end of the vapor cell;
measuring the intensity of the probe beam by making the probe beam pass through the linear polarizer; and
extracting a polarization rotation angle of the probe beam as a modulation frequency component or its high-frequency harmonics components from the measured intensity of the probe beam.

18. The operating method as set forth in claim 14, further comprising:
establishing a compensation magnetic field to remove an external environmental magnetic field having an effect on the vapor cell while the measurement target is removed,
wherein the compensation magnetic field includes a y-axis compensation magnetic field orthogonal to a first plane to which the pump beam and the probe beam travels, an x-axis compensation magnetic field parallel to the first plane, and a z-axis compensation magnetic field orthogonal to the x-axis compensation magnetic field,
wherein the y-axis compensation magnetic field is set to a y-axis DC value such that the polarization rotation angle is made zero under the external environment magnetic field,
wherein the x-axis compensation magnetic field is set to an x-axis DC value such that the polarization rotation angle is made zero under the external environmental magnetic field, and
wherein the z-axis compensation magnetic field is set to a z-axis DC value such that the polarization rotation angle is made zero under the external environmental magnetic field.

19. An atomic magnetometer comprising:
a vapor cell configured to receive a circularly polarized pump beam and a linearly polarized probe beam, wherein the vapor cell contains an alkali metal vapor;
a detector configured to receive the probe beam passing through the vapor cell to measure magneto-optical rotation of the probe beam;
a pump laser configured to provide the circularly polarized pump beam; and
a pump beam light intensity modulation part configured to receive an output signal of the detector, such that a negative feedback driving signal proportional to a measurement magnetic field is established to control a light intensity of the pump beam light source,
wherein the measurement magnetic field of a measurement target provides magneto-optical rotation of the probe beam in the vapor cell,
wherein the vapor cell includes a main cell with a hexahedronal shape, a cylindrical stem cell connected to the main cell, and a heating part configured to heat the vapor cell, the heating part comprising:
a first heating part to apply alternating current of 5 kHz to 30 kHz to a heating wire to heat the main cell of the vapor cell at a temperature of 200 degrees centigrade; and
a second heating part to apply alternating current of 5 kHz to 30 kHz to a heating wire to heat the stem cell of the vapor cell at a temperature of 185 degrees centigrade, and
wherein a difference between a temperature of the main cell and a temperature of the stem cell is constantly maintained.

20. The atomic magnetometer as set forth in claim 19, wherein the pump beam light intensity modulation part comprises:
an electro-optical modulator driver adapted to receive an output signal of the detector to output the driving signal;
an electro-optical modulator adapted to receive the driving signal to change a polarization state of the pump beam; and
a polarization beam splitter adapted to extract a specific polarization component from the pump beam passing through the electro-optical modulator.

21. An operating method of an atomic magnetometer, the method comprising:
providing a circularly polarized pump beam and a linearly polarized probe beam to a vapor cell containing an alkali metal vapor under a measurement magnetic field established by a measurement target;
detecting a polarization rotation signal from the linearly polarization probe beam passing through the vapor cell according to a polarization state of the probe beam by using a detector; and
negatively feedback-controlling the intensity of a circularly polarized pump beam by using the polarization rotation signal; and
providing, via a feedback amplifier, a feedback current to a feedback coil such that the negative feedback magnetic field proportional to the measurement magnetic field is established,
wherein the measurement magnetic field of a measurement target provides magneto-optical rotation of the probe beam in the vapor cell,
wherein the vapor cell includes a main cell having a hexahedronal shape, a cylindrical stem cell connected to the main cell, and a heating part configured to heat the vapor cell, the heating part comprising:
a first heating part to apply alternating current of 5 kHz to 30 kHz to a heating wire to heat the main cell of the vapor cell at a temperature of 200 degrees centigrade; and
a second heating part to apply alternating current of 5 kHz to 30 kHz to a heating wire to heat the stem cell of the vapor cell at a temperature of 185 degrees centigrade, and
wherein a difference between a temperature of the main cell and a temperature of the stem cell is constantly maintained.

* * * * *